United States Patent
Yanagita et al.

(10) Patent No.: US 6,653,205 B2
(45) Date of Patent: Nov. 25, 2003

(54) COMPOSITE MEMBER SEPARATING METHOD, THIN FILM MANUFACTURING METHOD, AND COMPOSITE MEMBER SEPARATING APPARATUS

(75) Inventors: Kazutaka Yanagita, Ohta-ku (JP); Kazuaki Ohmi, Ohta-ku (JP); Kiyofumi Sakaguchi, Ohta-ku (JP)

(73) Assignee: Canon Kabushiki Kaisha, Tokyo (JP)

( * ) Notice: Subject to any disclaimer, the term of this patent is extended or adjusted under 35 U.S.C. 154(b) by 70 days.

(21) Appl. No.: 09/730,560

(22) Filed: Dec. 7, 2000

(65) Prior Publication Data

US 2001/0003668 A1 Jun. 14, 2001

(30) Foreign Application Priority Data

Dec. 8, 1999 (JP) .............................. 11-349209

(51) Int. Cl.[7] .............................................. H01L 21/46
(52) U.S. Cl. ...................... 438/455; 438/458; 438/455; 156/584
(58) Field of Search .............................. 438/519, 455, 438/458, 459, 440, 442, 475, 457; 156/584, 344

(56) References Cited

U.S. PATENT DOCUMENTS

| | | | | |
|---|---|---|---|---|
| 5,854,123 | A | 12/1998 | Sato et al. | 438/507 |
| 5,856,229 | A | 1/1999 | Sakaguchi et al. | 438/406 |
| 5,897,743 | A | 4/1999 | Fujimoto et al. | 156/584 |
| 5,966,620 | A | 10/1999 | Sakaguchi et al. | 438/455 |
| 6,054,363 | A | 4/2000 | Sakaguchi et al. | 438/406 |
| 6,100,166 | A | 8/2000 | Sakaguchi et al. | 438/455 |
| 6,263,941 | B1 * | 7/2001 | Bryan et al. | 438/455 |
| 6,391,740 | B1 * | 5/2002 | Cheung et al. | 438/455 |
| 6,418,999 | B1 | 7/2002 | Yanagita et al. | 156/584 |
| 6,436,226 | B1 | 8/2002 | Omi et al. | 156/344 |
| 2001/0001975 | A1 | 5/2001 | Sakaguchi et al. | 156/239 |

FOREIGN PATENT DOCUMENTS

| | | |
|---|---|---|
| EP | 0867917 | 9/1998 |
| JP | 5-211128 | 8/1993 |
| JP | 7-302889 | 11/1995 |
| JP | 9-263500 | 10/1997 |
| JP | 10-233352 | 9/1998 |

OTHER PUBLICATIONS

Uiiler, Jr., "Electrolytic Shaping of Germanium and Silicon", Bell System Tech. Journ., vol. 35, pp. 333–347 (1956).
Unagami, "Formation Mechanism of Porous . . . in HF Solution", J. Electrochem. Soc., vol. 127, No. 2, pp. 476–483 (1980).
Imai, "A New Dielectric Isolation Method Using Porous Silicon", Solid State Electronics, vol. 24, pp. 159–164 (1981).
Holstrom et al., "Complete dielectric isolation . . . oxidized porous silicon", Appl. Phys. Lett., vol. 42, No. 4, 386–388 (1983).
Nagano et al., "Oxidized Porous Silicon and its Application", IEICE Technical Report, vol. 79, SSD79–9549 (1979).

* cited by examiner

Primary Examiner—Caridad Everhart
(74) Attorney, Agent, or Firm—Fitzpatrick, Cella, Harper & Scinto

(57) ABSTRACT

This invention relates to a composite member separating method in which a first member (1) having a separation layer (4) and a transfer layer (5) on the separation layer (4) is bonded to a second member (2) is separated at a position different from the bonding interface between the first member (1) and the second member (2), the method comprising the steps of, applying a force asymmetric with respect to the interface to the end portion of the composite member to form a crack (7A) that runs from the surface of the first member (1) to the separation layer (4) through the transfer layer (5), and then, growing the crack is grown along the separation layer (4) to completely separate the composite member.

47 Claims, 37 Drawing Sheets

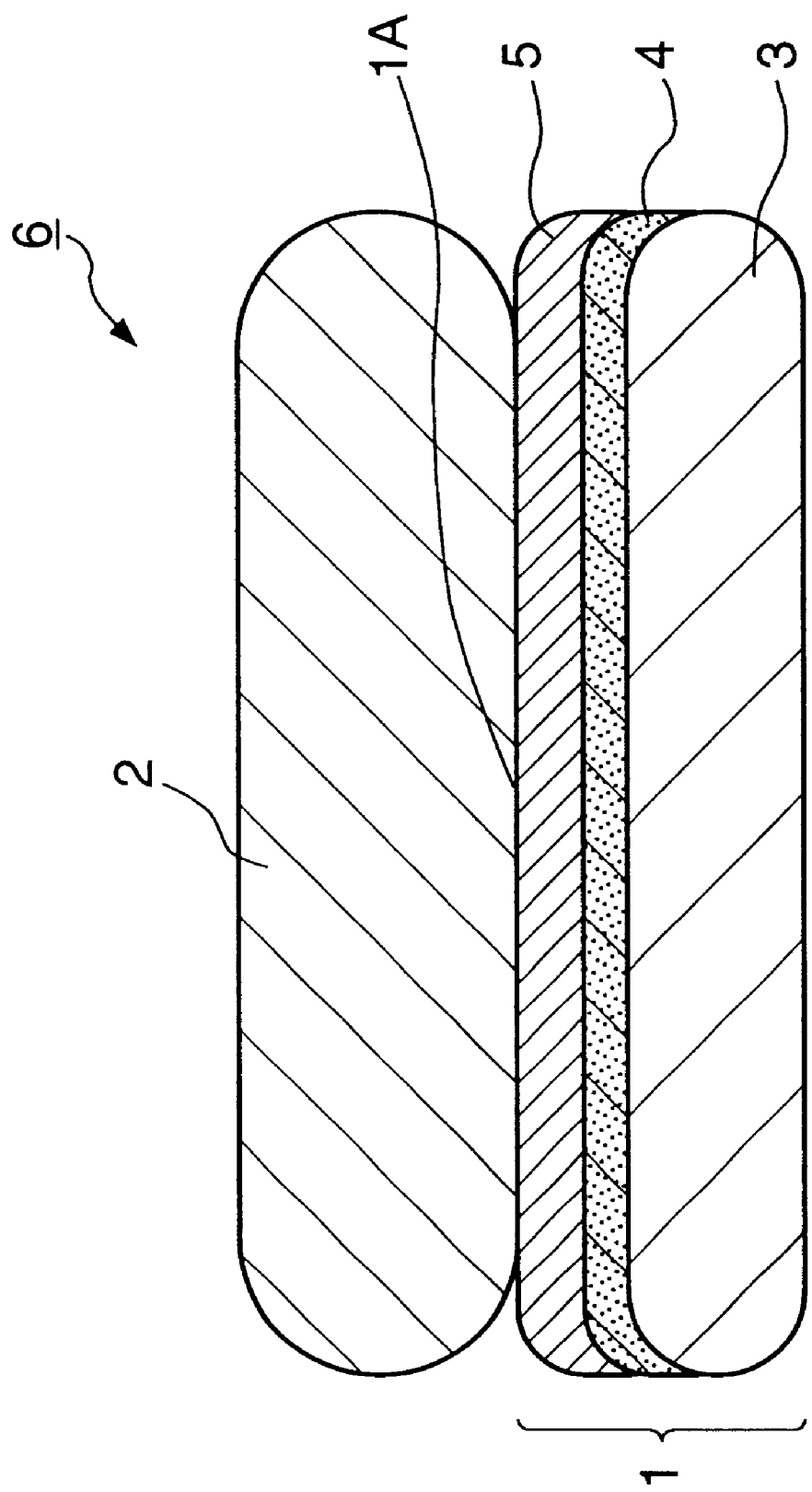

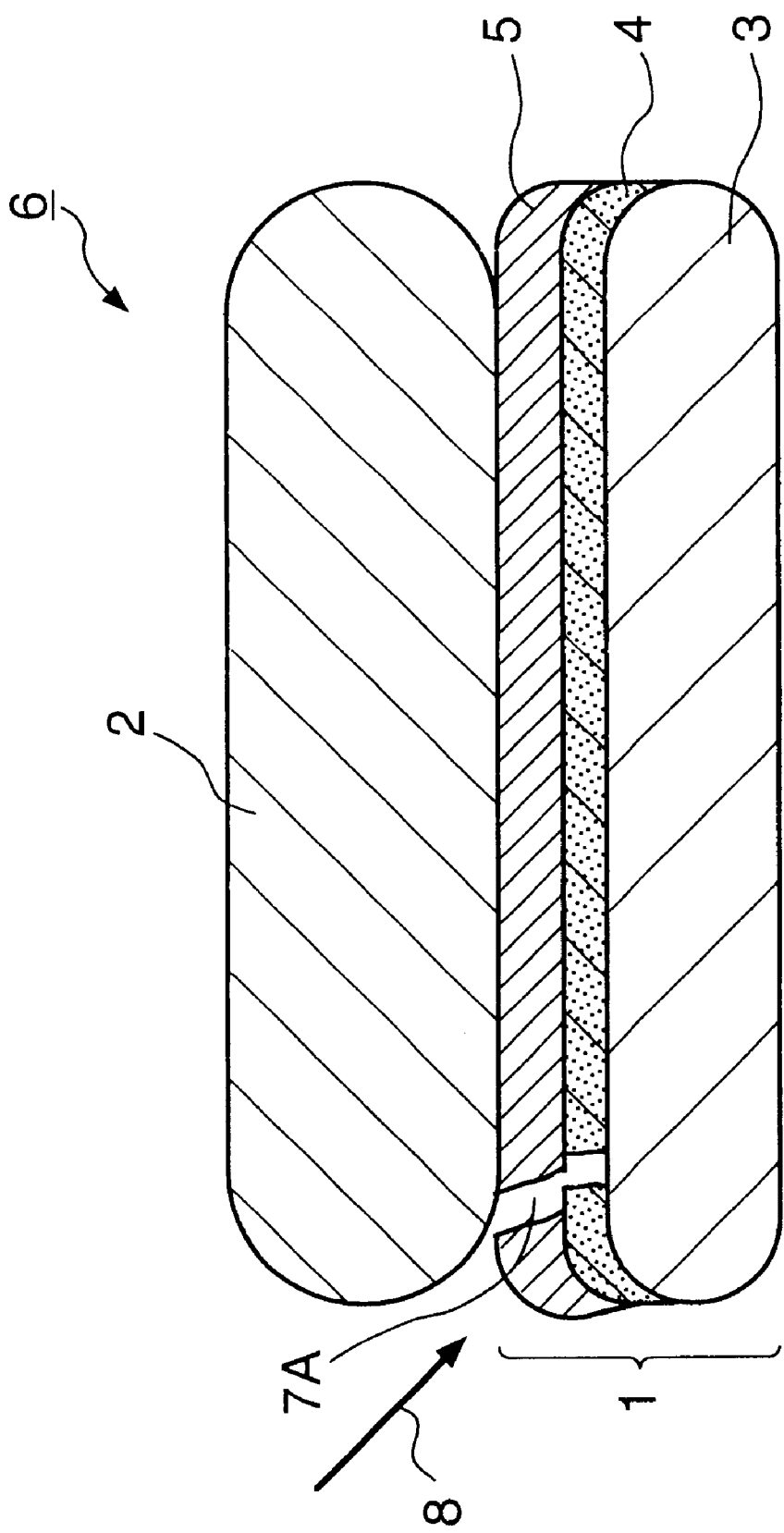

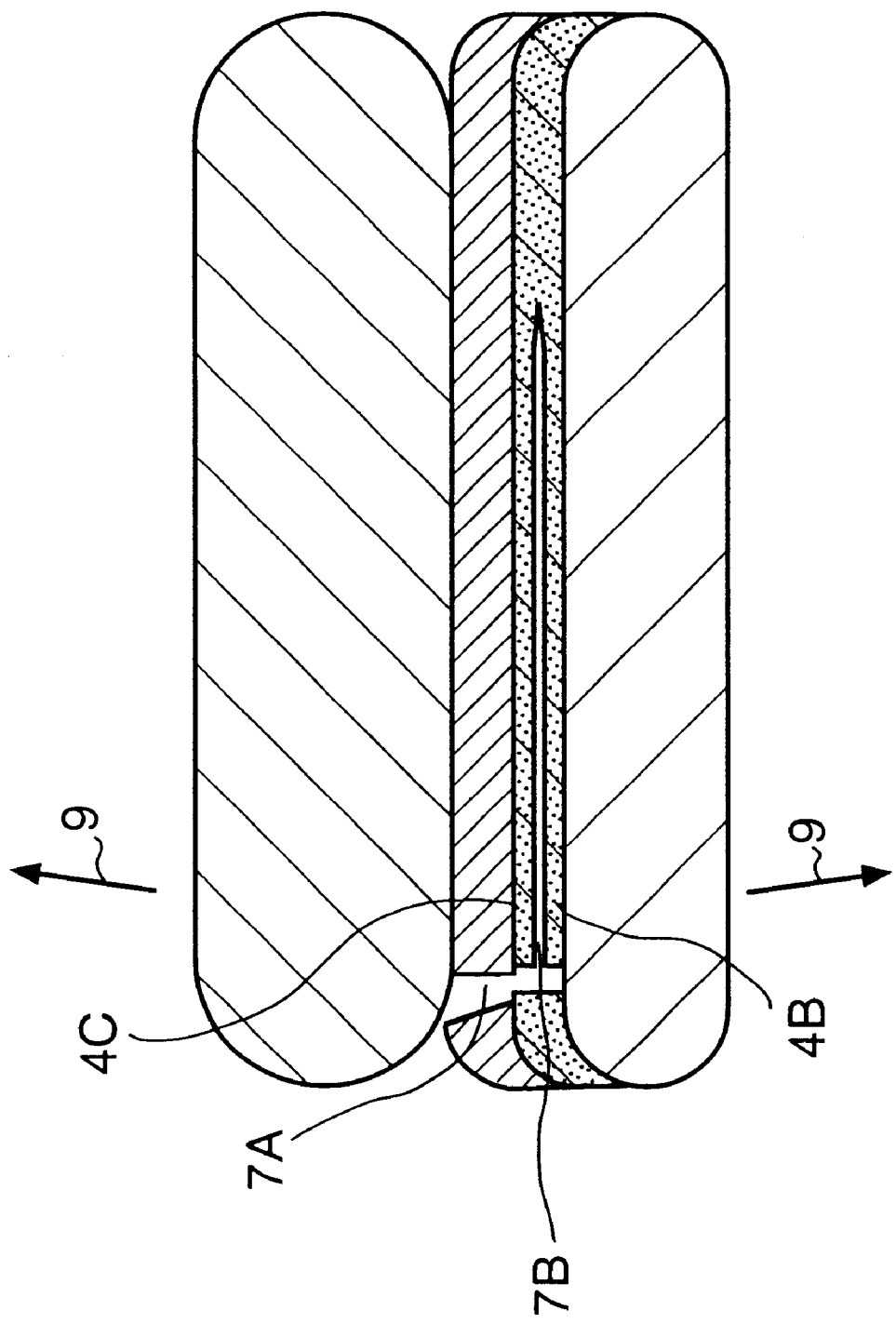

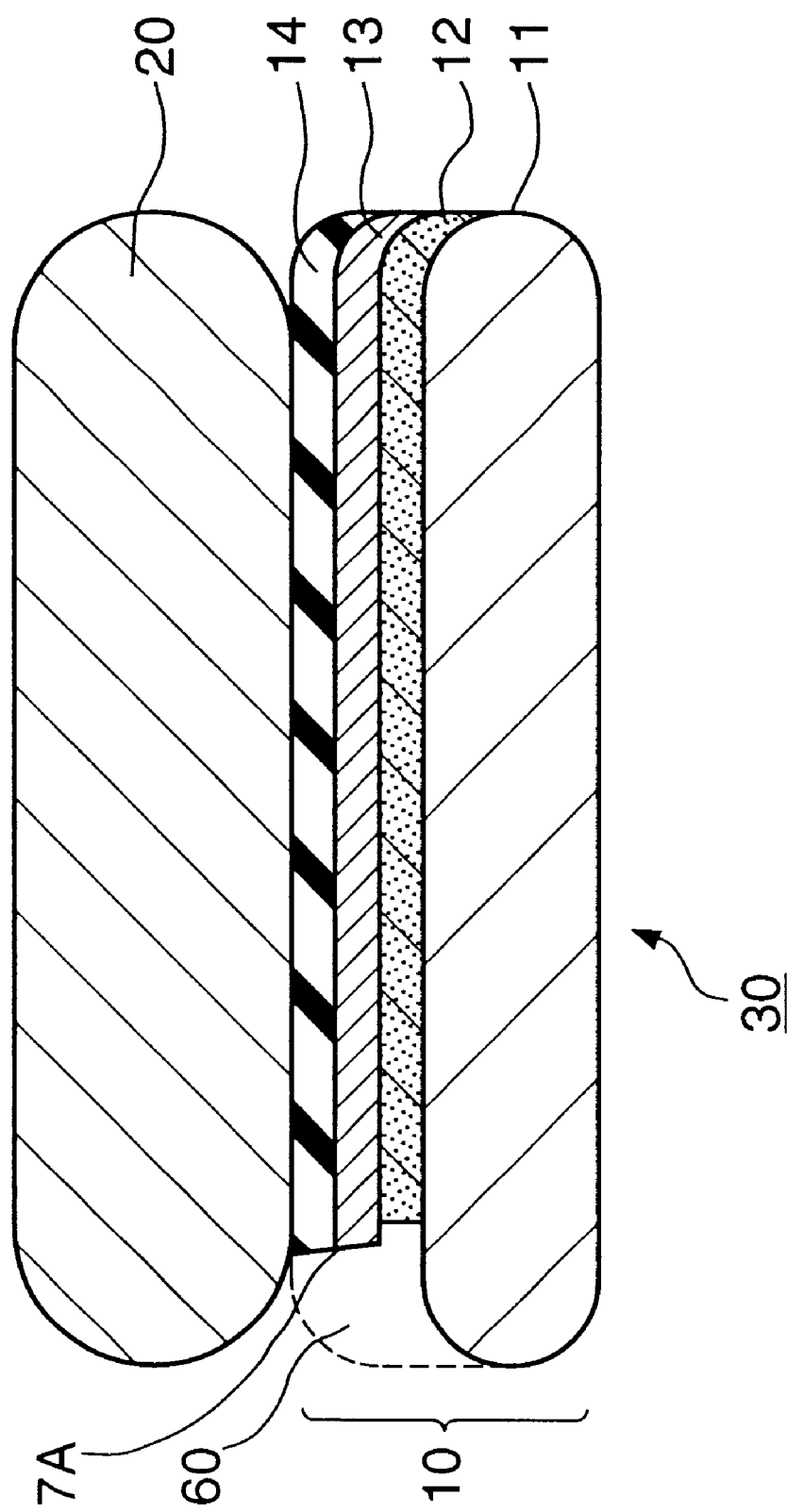

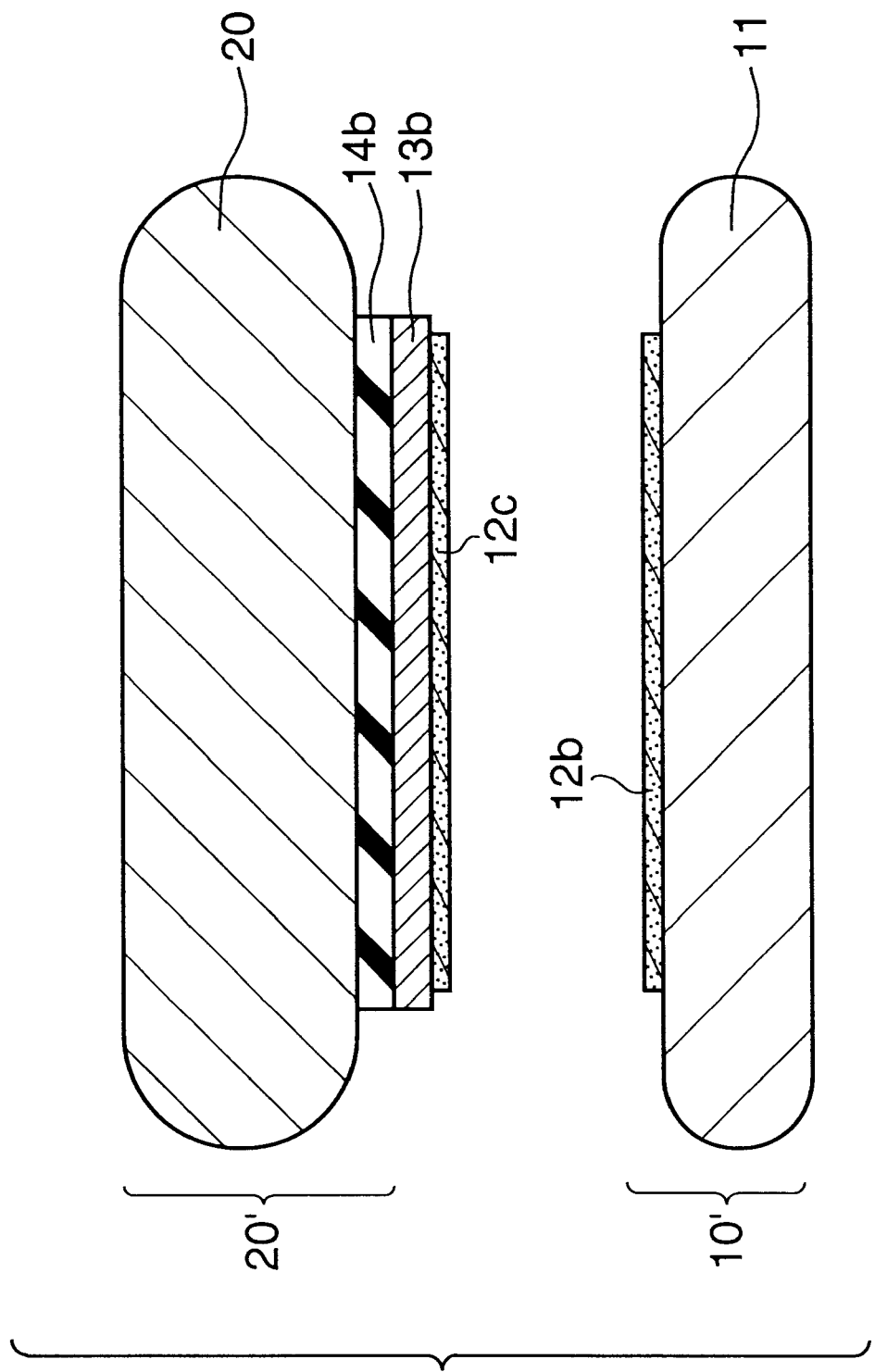

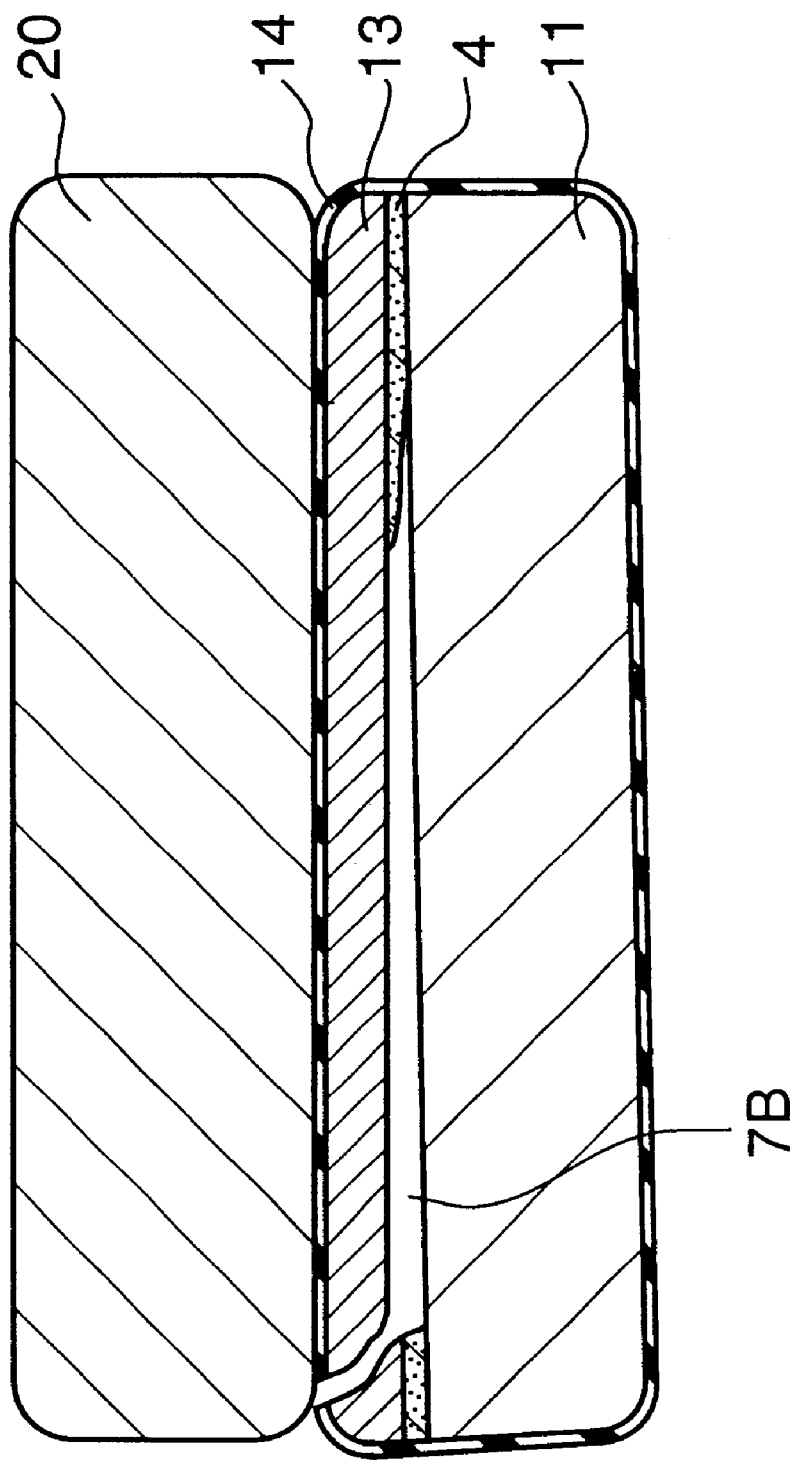

COMPOSITE MEMBER SEPARATING METHOD, THIN FILM MANUFACTURING METHOD, AND COMPOSITE MEMBER SEPARATING APPARATUS

FIELD OF THE INVENTION

The composite member relates to a composite member separating method, thin film manufacturing method, and composite member separating apparatus.

BACKGROUND OF THE INVENTION

Various manufacturing methods have been proposed to form a thin film of an insulator (dielectric material), conductor, semiconductor, or magnetic material, including a method of separating a composite member constructed by at least two kinds of layers having different materials or structures to form a thin film.

An SOI layer will be exemplified below as a thin film to help understand these methods.

Japanese Patent Laid-Open No. 7-302889 and U.S. Pat. No. 5,856,229 disclose a method of bonding a first member having a porous layer formed on a single-crystal Si substrate and a single-crystal non-porous layer thereon to a second member via an insulating layer to form a composite member, and separating the composite member into two parts at the porous layer acting as a separation layer, thereby transferring the single-crystal non-porous layer to the second member. This technique is excellent because the film thickness uniformity of the SOI layer is high, the crystal defect density in the SOI layer can be reduced, the surface planarity of the SOI layer is good, and an SOI substrate having an SOI layer having a thickness of about several ten nm to ten μm can be manufactured.

Additionally, this method is advantageous because the single-crystal Si substrate can be separated from the second member without breaking most part of the single-crystal Si substrate, and the separated Si substrate can be reused.

To separate the bonded substrate stack into two substrates, for example, the two substrates are pulled in opposite directions while applying a force in a direction perpendicular to the bonding interface, a shearing force is applied parallel to the bonding interface (for example, the two substrates are moved in opposite directions in a plane parallel to the bonding interface, or the two substrates are rotated in opposite directions while applying a force in the circumferential direction), a pressure is applied in a direction perpendicular to the bonding interface, a wave energy such as an ultrasonic wave is applied to the separation region, a peeling member (e.g., a sharp blade such as knife) is inserted into the separation region parallel to the bonding interface from the side surface side of the bonded substrate stack, the expansion energy of a substance filling the pores of the porous layer functioning as the separation region is used, the porous layer functioning as the separation region is thermally oxidized from the side surface of the bonded substrate stack to expand the volume of the porous layer and separate the substrates, or the porous layer functioning as the separation region is selectively etched from the side surface of the bonded substrate stack to separate the substrates.

Such a method is disclosed in U.S. Pat. No. 5,854,123, Japanese Patent Laid-Open No. 11-237884, 10-233352, or European Patent Laid-Open No. 0867917.

Japanese Patent Laid-Open No. 5-211128 and U.S. Pat. No. 5,374,564 disclose a method of forming a substrate by implanting ions of, e.g., hydrogen into a single-crystal Si substrate from its upper surface side to form an ion implantation layer acting as a separation layer in the substrate, where the concentration of the implanted ions is locally high, bonding the resultant substrate to another substrate, and heating the bonded substrate stack to separate it into two parts.

In the above-described separating methods, how to stabilize the position where a crack forms at the initial stage of separation is important.

For example, if a crack that formed at a portion except the separation layer grows toward the center of a substrate in separating a bonded substrate stack, a thin film as a prospective SOI layer breaks to lower the manufacturing yield of SOI substrates.

SUMMARY OF THE INVENTION

The present invention has been made in consideration of the above situation, and has as its first object to, e.g., improve the reproducibility of a crack generation position in a composite member such as a bonded substrate stack and suppress the amount of damage to the thin film at the end portion.

It is the second object of the present invention to appropriately separate a composite member at a separation layer such as a porous layer or ion implantation layer.

According to the first aspect of the present invention, there is provided a composite member separating method of separating a composite member formed by bonding a first member having a separation layer and a transfer layer on the separation layer to a second member, at a position different from a bonding interface between the first member and the second member, comprising the pre-separation step including the step of applying a force asymmetric with respect to the bonding interface to an end portion of the composite member to form, in the composite member, a crack that runs from a surface of the first member to the separation layer through the transfer layer, and the actual separation step including the step of growing the crack along the separation layer.

According to the second aspect of the present invention, there is provided a thin film manufacturing method comprising the step of bonding a first member having a separation layer and a transfer layer on the separation layer to a second member to form a composite member, and the separation step of separating the composite member at a position different from a bonding interface between the first member and the second member, wherein the separation step comprises the first step of applying a force asymmetric with respect to the bonding interface to an end portion of the composite member to form, in the composite member, a crack that runs from a surface of the first member to the separation layer through the transfer layer, and the second step of growing the crack along the separation layer.

According to the third aspect of the present invention, there is provided a composite member separating apparatus for separating a composite member formed by bonding a first member having a separation layer and a transfer layer on the separation layer to a second member, at a position different from a bonding interface between the first member and the second member, comprising a pre-separation mechanism for applying a force asymmetric with respect to the bonding interface to an end portion of the composite member to form, in the composite member, a crack that runs from a surface of the first member to the separation layer through the transfer layer, and an actual separation mechanism for growing the crack along the separation layer.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 1A, 1B, and 1C are schematic views for explaining a composite member separating method according to a preferred embodiment of the present invention;

FIG. 2D is a schematic view for explaining the process of forming a separation start portion (pre-separation process) in the SOI substrate manufacturing method according to the preferred embodiment of the present invention;

FIG. 2E is a schematic view for explaining the separation process (actual separation process) in the SOI substrate manufacturing method according to the preferred embodiment of the present invention;

FIGS. 25A, 25B, 25C, 25D, and 25E are schematic views for explaining a thin film manufacturing method according to the preferred embodiment of the present invention.

DETAILED DESCRIPTION OF THE PREFERRED EMBODIMENTS

Figure 2A:
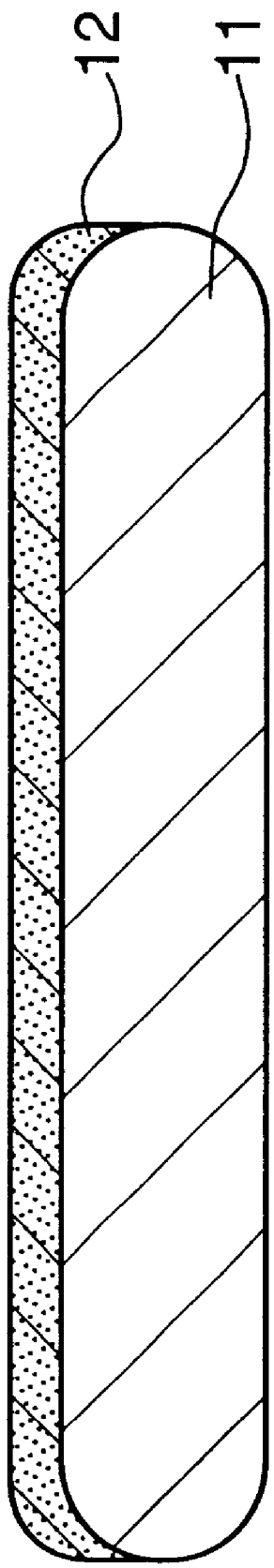
FIG. 2A is a schematic view for explaining the process of forming a porous layer in an SOI substrate manufacturing method according to the preferred embodiment of the present invention.

Preferred embodiments of the present invention will be described below with reference to the accompanying drawings.

FIGS. 1A to 1C are schematic views for schematically explaining a composite member separating method according to a preferred embodiment of the present invention.

A first member 1 has a separation layer 4 formed inside. A surface layer (transfer layer) 5 of the first member is on the separation layer 4. This surface layer is to be transferred to the second member later. A substrate 3 of the first member is under the separation layer 4. A composite member 6 is manufactured and prepared by bonding the first member 1 having the separation layer 4 inside to a second member 2. Reference numeral 1A denotes a bonding interface.

The separating method of this embodiment includes a pre-separation process shown in FIG. 1B and an actual separation process shown in FIG. 1C to separate the composite member 6 at a position different from the bonding interface 1A between the first member 1 and the second member 2.

In the pre-separation process, as shown in FIG. 1B, a force 8 asymmetric with respect to the bonding interface 1A is applied to the end portion of the composite member 6 to form a crack 7A in the composite member 6, which runs from the surface of the first member 1 to the separation layer 4 through the transfer layer 5. This external force 8 asymmetric with respect to the bonding interface suppresses the crack 7A from horizontally running parallel to the bonding interface toward the center of the composite member 6. In the example shown in FIG. 1B, the distal end of the crack 7A reaches the upper surface of the substrate 3. However, the distal end of the crack 7A need only reach the upper surface or interior of the separation layer 4.

In the actual separation process, a crack 7B is grown along the separation layer 4 from the separation start portion where the crack 7A has been formed, as shown in FIG. 1C. The crack 7A has already reached the separation layer 4 in the first member 1 in the pre-separation process. Then, a separation force 9 that separates the first and second members is applied so that the crack 7B is generated in the separation layer 4 or the interface between the upper and lower portions of the separation layer 4 and grown along the separation layer 4. FIG. 1C exemplifies a state in which the crack 7A grows in the separation layer 4.

Thus, the most portion of the transfer layer 5 is transferred onto the second member 2 without damage. Only a small part of the end portion of the transfer layer 5 is lost without transfer to the second member.

The transfer layer 5 used in the present invention means a layer in which a crack is formed in the pre-separation process and which is transferred to the second member side by separation in the actual separation process. As such a transfer layer 5, at least one layer selected from layers formed from insulator, conductor, semiconductor, and magnetic materials is used. Detailed examples of the semiconductor layer are single-crystal Si layer, polysilicon layer, amorphous Si layer, Ge layer, SiGe layer, SiC layer, C layer, and compound semiconductor (e.g., GaAs, InP, or GaN) layer. Detailed examples of the insulator layer are a silicon oxide layer, silicon nitride layer, and silicon oxynitride layer. When ion implantation (to be described later) is used as a separation layer forming method, the surface layer of the implanted substrate is used as a transfer layer.

The separation layer 4 used in the present invention is a layer which provides the exposed surface after separation upon forming a crack in the separation layer or on the upper or lower interface in the actual separation process. Of the components of the composite member, a layer region or interface having a structure with a relatively low mechanical strength or a layer region or interface where stress relatively concentrates can be used as a separation layer in the present invention. More specifically, a porous layer formed by anodizing or implanting ions of hydrogen, nitrogen, or a rare gas can be used. When ion implantation is performed, stress or defects are generated in the structure at that time to lower the mechanical strength. For this reason, the structure can be used as a separation layer even when no porous layer is formed by microcavities.

Porous Si was found in 1956 by Uhlir et al. who were studying electropolishing of semiconductors (A. Uhlir, Bell Syst. Tech. J., vol. 35, 333 (1956)). Porous Si can be formed by anodizing an Si substrate in an HF solution.

Unagami et al. studied the dissolution reaction of Si upon anodizing and reported that holes were necessary for anodizing reaction of Si in an HF solution, and the reaction was as follows (T. Unagami, J. Electrochem. Soc., vol. 127, 476 (1980)).

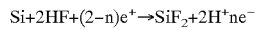

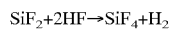

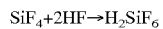

or

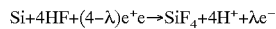

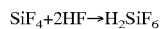

where $e^+$ and $e^-$ represent a hole and an electron, respectively, and n and λ are the number of holes necessary to dissolve one Si atom. According to them, when n>2 or λ>4, porous Si is formed.

The above fact suggests that p-type Si having holes is converted into porous Si while n-type Si is not converted. The selectivity in this conversion has been reported by Nagano et al. and Imai (Nagano, Nakajima, Anno, Onaka, and Kajiwara, IEICE Technical Report, vol. 79, SSD79-9549 (1979)), (K. Imai, Solid-State Electronics, vol. 24, 159 (1981)).

However, it has also been reported that n-type Si at a high concentration is converted into porous Si (R. P. Holmstrom and J. Y. Chi, Appl. Phys. Lett., vol. 42, 386 (1983)). Hence, it is important to select a substrate which can be converted into a porous Si substrate independently of p- or n-type.

It is also preferable to prepare a composite member by bonding the first and second members, anneal the composite member in an oxidation atmosphere to increase the bonding strength, and forming an oxide film on the exposed surface of the composite member. In this case, since the end portion of the composite member, which serves as a separation start portion, is also covered with the oxide film, satisfactory separation can be done using the method of the present invention.

How to apply the asymmetric external force used in the pre-separation process and how to apply the external force used in the actual separation process will be described later with reference to the accompanying drawings.

FIGS. 2A to 2G are schematic views for schematically explaining an SOI substrate manufacturing method according to the preferred embodiment of the present invention.

In the step shown in FIG. 2A, a single-crystal Si substrate 11 is prepared, and a porous Si layer (separation layer) 12 is formed on the surface of the single-crystal Si substrate 11 by, e.g., anodizing.

Figure 2B:
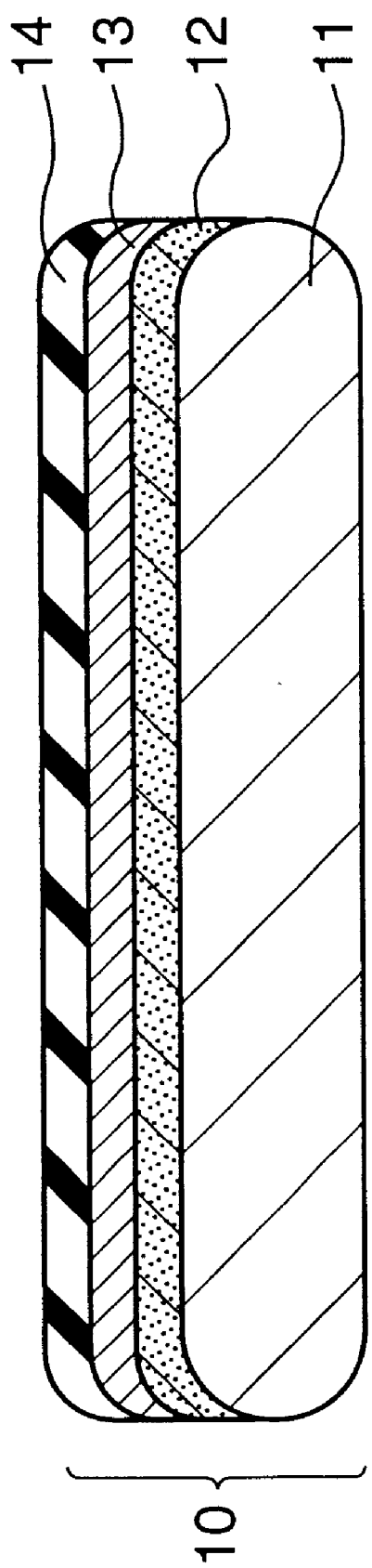
FIG. 2B is a schematic view for explaining the process of forming a single-crystal Si layer and insulating layer in the SOI substrate manufacturing method according to the preferred embodiment of the present invention.

In the step shown in FIG. 2B, a non-porous single-crystal Si layer 13 is formed on the porous Si layer 12 by epitaxial growth. The surface of the non-porous single-crystal Si layer 13 is oxidized to form an insulating layer ($SiO_2$ layer) 14. With this process, a first substrate (first member) 10 is formed. The single-crystal Si layer 13 and insulating layer 14 construct a transfer layer.

The porous Si layer 12 may be formed by, e.g., a method of implanting hydrogen ions or ions of an inert gas such as helium into the single-crystal Si substrate 11 (ion implantation). The porous Si layer formed by this method has a number of microcavities and is therefore called a microcavity layer.

Figure 2C:
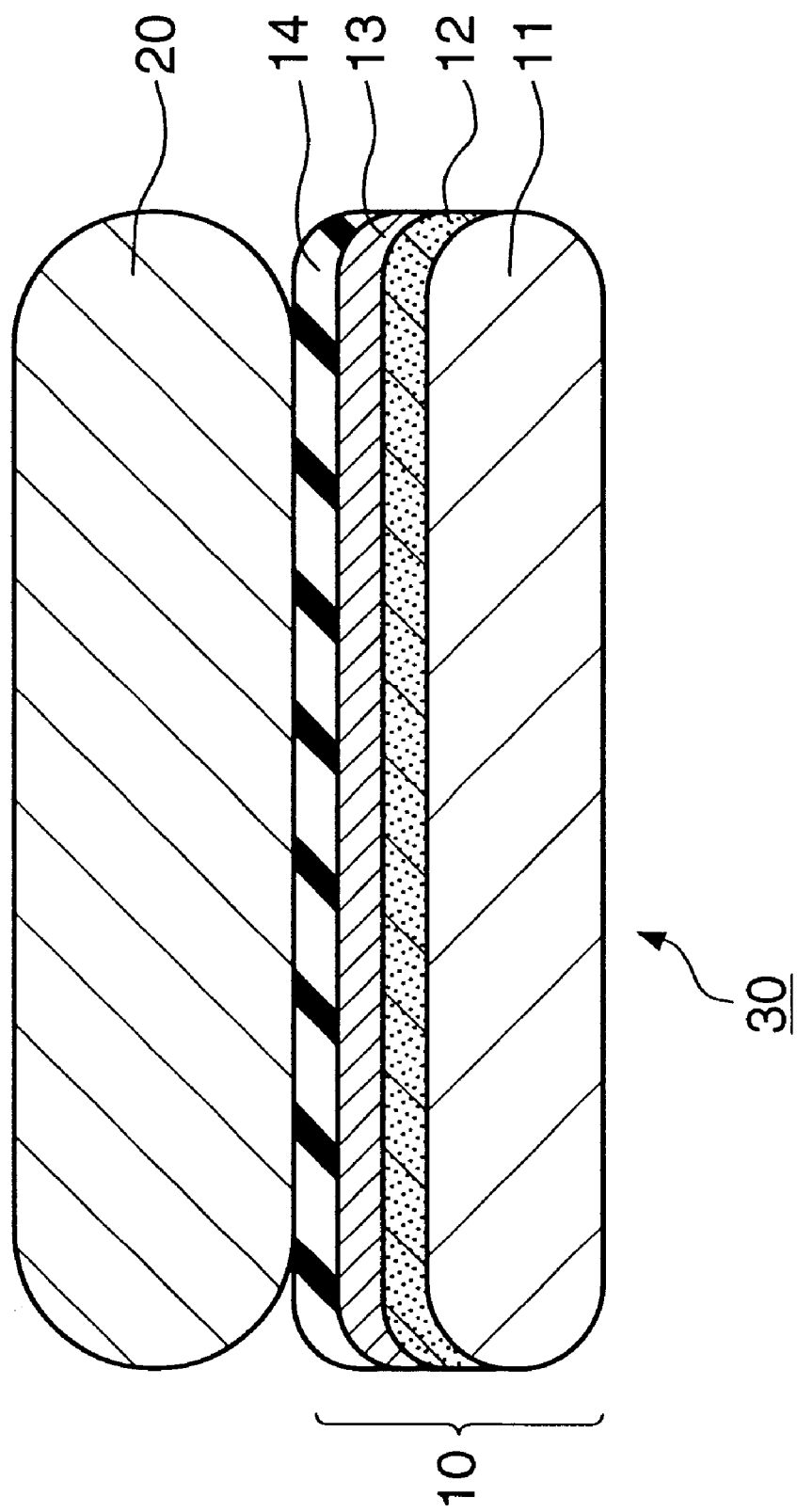
FIG. 2C is a schematic view for explaining the bonding process in the SOI substrate manufacturing method according to the preferred embodiment of the present invention.

In the step shown in FIG. 2C, a second substrate (second member) 20 of single-crystal Si is prepared and brought into tight contact with the first substrate 10 at room temperature while making the insulating layer 14 oppose the second substrate 20, thereby forming a bonded substrate stack (composite member).

The insulating layer 14 may be formed on the single-crystal Si layer 13 side of the first substrate, as described above, on the second substrate 20, or on both single-crystal Si layer 13 and second substrate 20 as far as the state shown in FIG. 2C is obtained upon bringing the first and second substrates into tight contact with each other. However, when the insulating layer 14 is formed on the side of the single-crystal Si layer 13 serving as an active layer, the bonding interface (bonding interface) between the first and second substrates 10 and 20 can be apart from the active layer. For this reason, an SOI substrate having a higher quality can be obtained.

In the step shown in FIG. 2D (pre-separation process), a separation start portion 60 as a portion where separation starts is formed. Separation of a bonded substrate stack 30 starts from the separation start portion 60 in the next actual separation process (FIG. 1E).

In the preferred embodiment of the present invention, a force asymmetric with respect to the bonding interface between the first and second substrates 10 and 20 is applied to the end portion of the bonded substrate stack 30. Especially, a separation member (e.g., a solid wedge) having an asymmetric structure or a substrate holding mechanism having an asymmetric structure is used.

To apply "asymmetric forces" to the first substrate 10 and second substrate 20, for example, the following methods are preferably used.

A solid wedge having a structure and/or function for applying a force asymmetric with respect to the bonding interface between the first and second substrates 10 and 20 is preferably inserted to the end portion of the bonded substrate stack 30.

More specifically, for example, a wedge having a shape asymmetric with respect to the bonding interface between the first and second substrates 10 and 20 is inserted to the bonding interface at the end portion of the bonded substrate stack 30.

Alternatively, a wedge whose hardness changes between the portion abutting against the first substrate 10 and that abutting against the second substrate 20 is inserted to the end portion of the bonded substrate stack 30.

Otherwise, a symmetric or asymmetric wedge is inserted to the bonding interface between the first and second substrates 10 and 20 and vibrated in a direction not perpendicular (in an asymmetric direction) to the bonding interface.

As still another method of applying the "asymmetric forces" to the first substrate 10 and second substrate 20, for example, the substrate holding portions for holding the substrates 10 and 20 are formed into asymmetric structures to change the degree of warp at the end portion between the substrates. When the end portion of the first substrate 10 warps upon receiving a moment larger than that for the end portion of the second substrate 20, a desired crack can be generated.

The relationship between the first force acting on the first substrate 10 and the second force acting on the second substrate 20 is determined such that the appropriate separation start portion 60 is formed in making the first force different from the second force.

The appropriate separation start portion means a separation start portion which provides a structure with which the bonded substrate stack 30 is separated into two substrates by breaking almost only the porous layer in the subsequent actual separation process (FIG. 2E).

More specifically, the appropriate separation start portion has a structure in which the porous layer is partially exposed to the atmosphere outside the bonded substrate stack 30, and can be formed by generating the crack 7A running from the surface of the first substrate 10, i.e., the surface of the insulating layer 14 in this case to the porous layer through the insulating layer 14 and single-crystal Si layer 13.

Although FIG. 2D shows the separation start portion 60 formed by removing a portion at the end of (outside) the crack 7A after or simultaneously with formation of the crack 7A, the portion at the end of (outside) the crack 7A need not always be removed, as shown in FIG. 1B.

As described above, when the separation start portion 60 is formed, the porous layer 12 can be selectively broken to separate the bonded substrate stack 30 into two substrates in the subsequent actual separation process (FIG. 2E), so generation of defects in the separation process can be effectively prevented.

Next, in the step shown in FIG. 2E (actual separation process), the bonded substrate stack 30 having the separation start portion 60 is completely separated into two substrates at the portion of the porous layer 12. The bonded substrate stack 30 is separated by starting growing the crack from the separation start portion 60 horizontally along the porous layer 12. For separation, for example, the following methods are preferably used.

(1) Separating Method Using Fluid

A jet of fluid (e.g., a liquid such as water or a gas such as air or nitrogen) is ejected to the separation start portion 60 of the bonded substrate stack 30 whereby the porous layer 12 near the separation start portion 60 is broken, and the fluid is injected thereto while gradually growing the separation region (separated region), i.e., the horizontal crack. When the fluid is ejected toward the end portion of the bonded substrate stack 30 while rotating the bonded substrate stack 30 having the separation start portion 60, growth of the crack starts at the timing when the fluid hits against the separation start portion 60. Hence, at the start of actual separation process, the fluid need not be positioned with respect to the separation start portion 60.

After that, the remaining porous layer 12 is wholly broken as separation progresses, thereby completely separating the bonded substrate stack 30. At this time, separation is preferably done while changing the fluid ejection position on the bonded substrate stack 30 by rotating the bonded substrate stack 30 in its plane.

When a fluid is used, instead of the above-described method using a jet fluid, a method using so-called a static-pressure fluid may be used, in which an enclosed space surrounding the separation start portion is formed using a sealing member such as an O-ring, the space is filled with a fluid, and the fluid is pressurized to grow a crack and inject the fluid thereto.

(2) Separating Method Using Solid Wedge

A wedge (e.g., a thin wedge made of a resin) is gently inserted to the separation start portion 60 of the bonded substrate stack 30 to take the two substrates apart from each other, thereby completely separating the bonded substrate stack 30.

When the separation start portion 60 is to be formed using a wedge, the two processes, i.e., the process of forming the separation start portion 60 (FIG. 2D) and the actual separation process (FIG. 2E) can be continuously executed using a single apparatus.

(3) Separating Method by Peeling

One surface of the bonded substrate stack 30 is fixed, and the other surface is pulled in the axial direction of the bonded substrate stack 30 using a flexible tape or the like, thereby completely separating the bonded substrate stack 30 at the portion of the porous layer 12. At the start of separation, the tensile force is applied such that the separation force concentrates to the separation start portion 60.

(4) Separating Method Using Shearing Stress

One surface of the bonded substrate stack 30 is fixed, and a force is applied to the other surface to move it in the plane direction of the bonded substrate stack 30, thereby completely separating the bonded substrate stack 30 at the portion of the porous layer 12 by sharing stress. For this method, the separation start portion 60 is preferably larger than for other methods so that separation starts from the separation start portion 60.

As described above, when the separation start portion 60 is formed, and then, separation processing (actual separation processing) is started from the separation start portion 60, the bonded substrate stack 30 can almost be separated only at the portion of the porous layer. Hence, the single-crystal Si layer 13, insulating layer 14, second substrate 20, single-crystal Si substrate 11, and the interfaces between these layers or substrates can be prevented from breaking and generating a serious defect.

As comparisons to the preferred embodiment of the present invention, the separation states of the bonded substrate stack 30 when symmetric forces are applied to the first substrate 10 and second substrate 20 to form the separation start portion and when the bonded substrate stack 30 is separated by applying symmetric forces to the first substrate 10 and second substrate 20 without forming the separation start portion will be examined.

Figure 3:
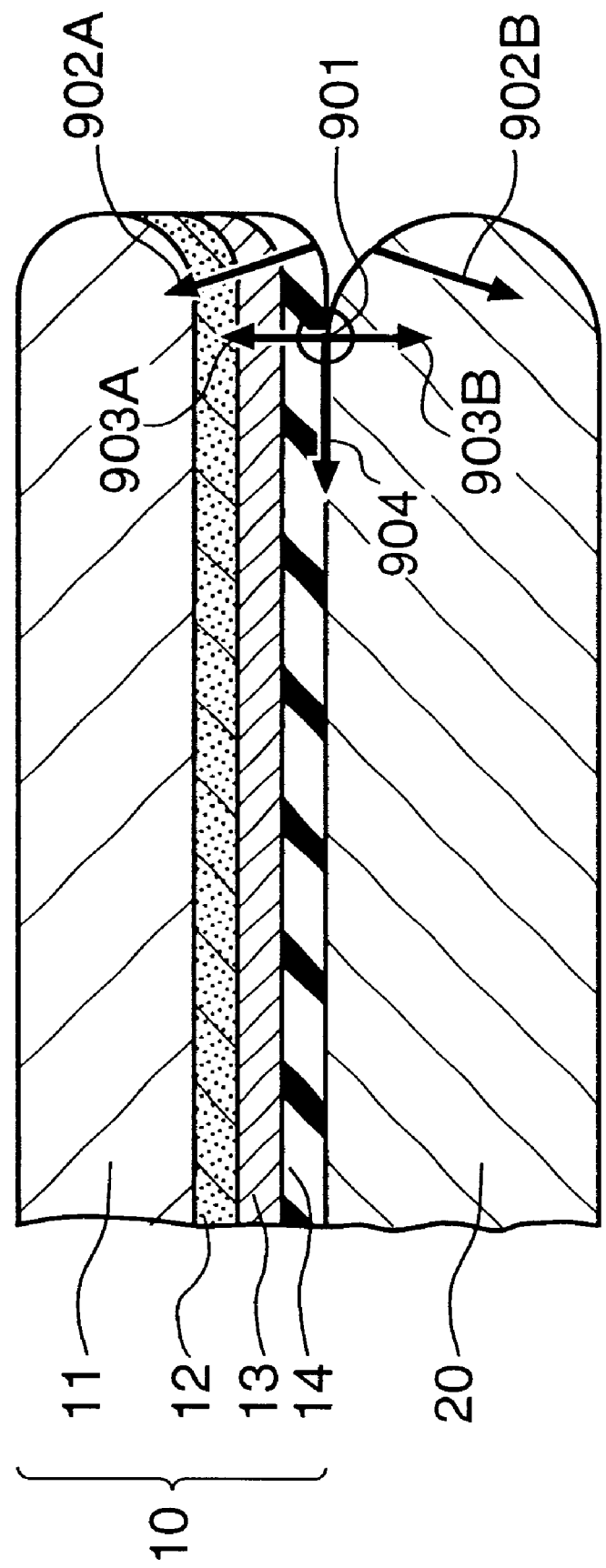
FIG. 3 is a schematic view showing a state in which symmetric forces are applied to the first and second substrates of the bonded substrate stack.

FIG. 3 is a schematic view showing a state in which symmetric forces are applied to the first substrate 10 and second substrate 20 of the bonded substrate stack.

As shown in FIG. 3, when forces 902A and 902B symmetric with respect to the bonding interface between the first and second substrates 10 and 20 are applied to the first substrate 10 and second substrate 20, respectively, tensile forces 903A and 903B symmetric with respect to the bonding interface act on a point of action 901 at the outermost portion of the bonding interface. Thus, the direction in which separation progresses is almost the plane direction (horizontal direction in FIG. 3) of the bonded substrate stack 30, as indicated by an arrow 904.

Figure 4:
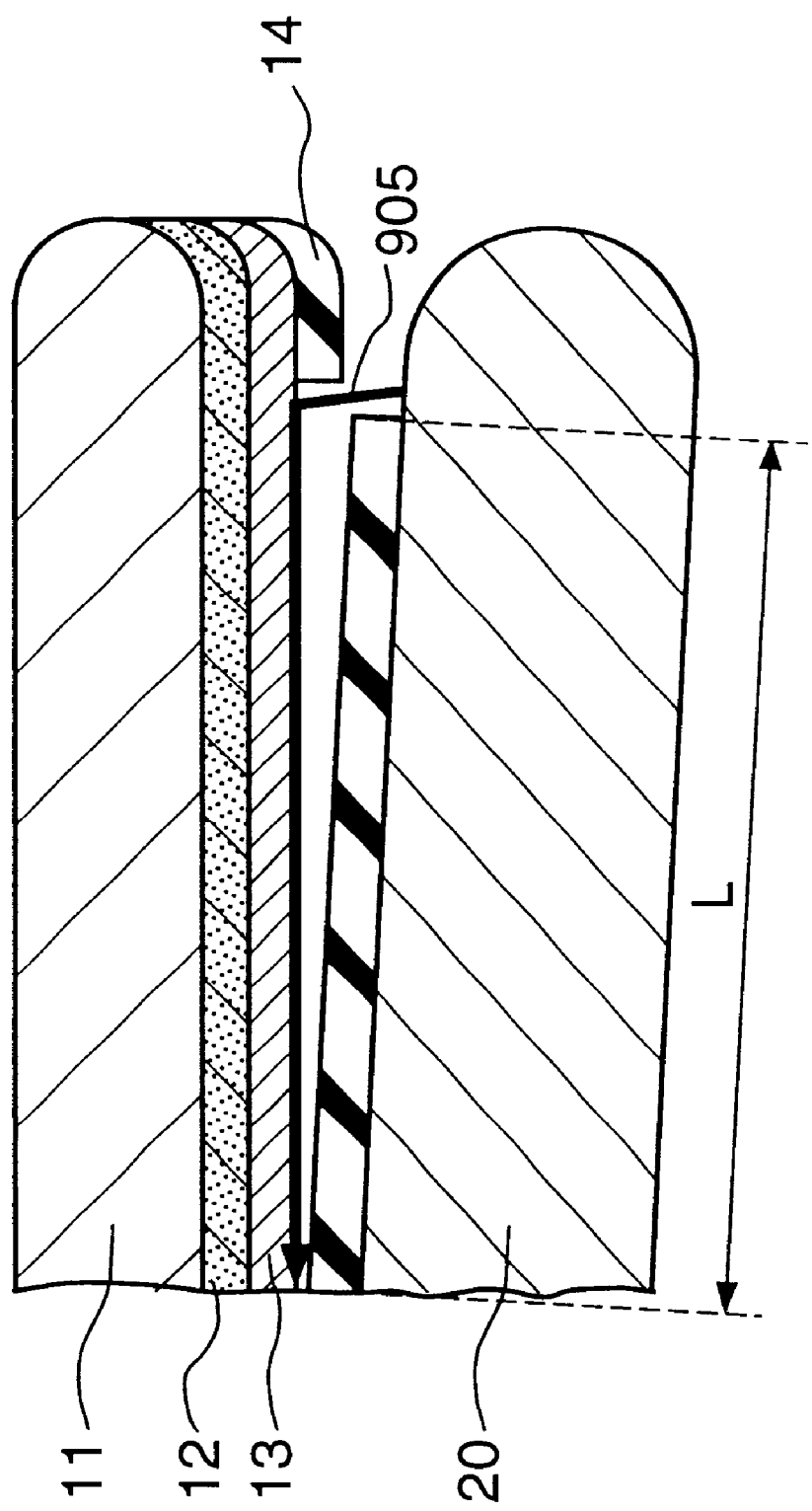
FIG. 4 is a view schematically showing a defect that can be generated by separation processing.

Hence, as indicated by an arrow 905 shown in FIG. 4, separation progresses by only an appropriate distance L along the interface between the single-crystal Si layer 13 and the insulating layer (SiO$_2$ layer) 14, where the structure is fragile next to the porous layer 12, without reaching the porous layer 12. In this case, since the portion separated along the interface between the single-crystal Si layer 13 and the insulating layer (SiO$_2$ layer) 14 is not transferred to the second substrate 20 side, a portion corresponding to the length L and a portion outside that portion are omitted to result in a defect.

However, since the interface between the single-crystal Si layer 13 and the insulating layer (SiO$_2$ layer) 14 has a higher structural strength than that of the porous layer 12, the horizontal crack generated in the interface rarely reaches the center of the substrate. Instead, the crack reaches the porous layer 12 through the single-crystal Si layer 13 midway, so most part is separated at the porous layer 12. If the distance L is long, the distance between the point where the crack reaches the porous layer 12 and the outer edge portion of the substrate may exceed 3 mm.

Figure 5:
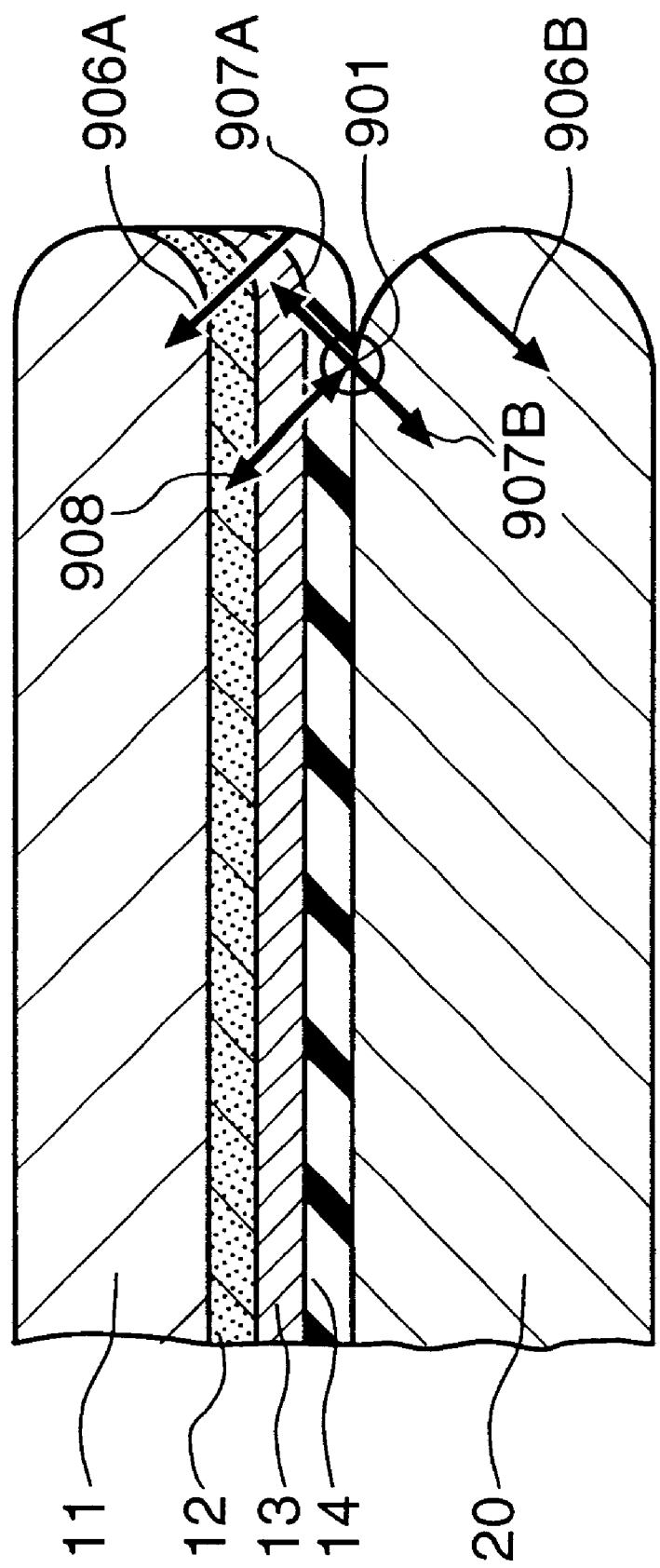
FIG. 5 is a view showing forces acting on the bonded substrate stack in forming the separation start portion in accordance with the preferred embodiment of the present invention.

To the contrary, according to the preferred embodiment of the present invention, as shown in FIG. 5, forces 906A and 906B asymmetric with respect to the bonding interface between the first and second substrates 10 and 20 are applied to the portion where the separation start portion should be formed, thereby applying asymmetric forces 907A and 907B to the bonding interface between the first and second substrates 10 and 20.

Thus, the crack can easily reach the porous layer 12, as indicated by an arrow 908.

Figure 6:
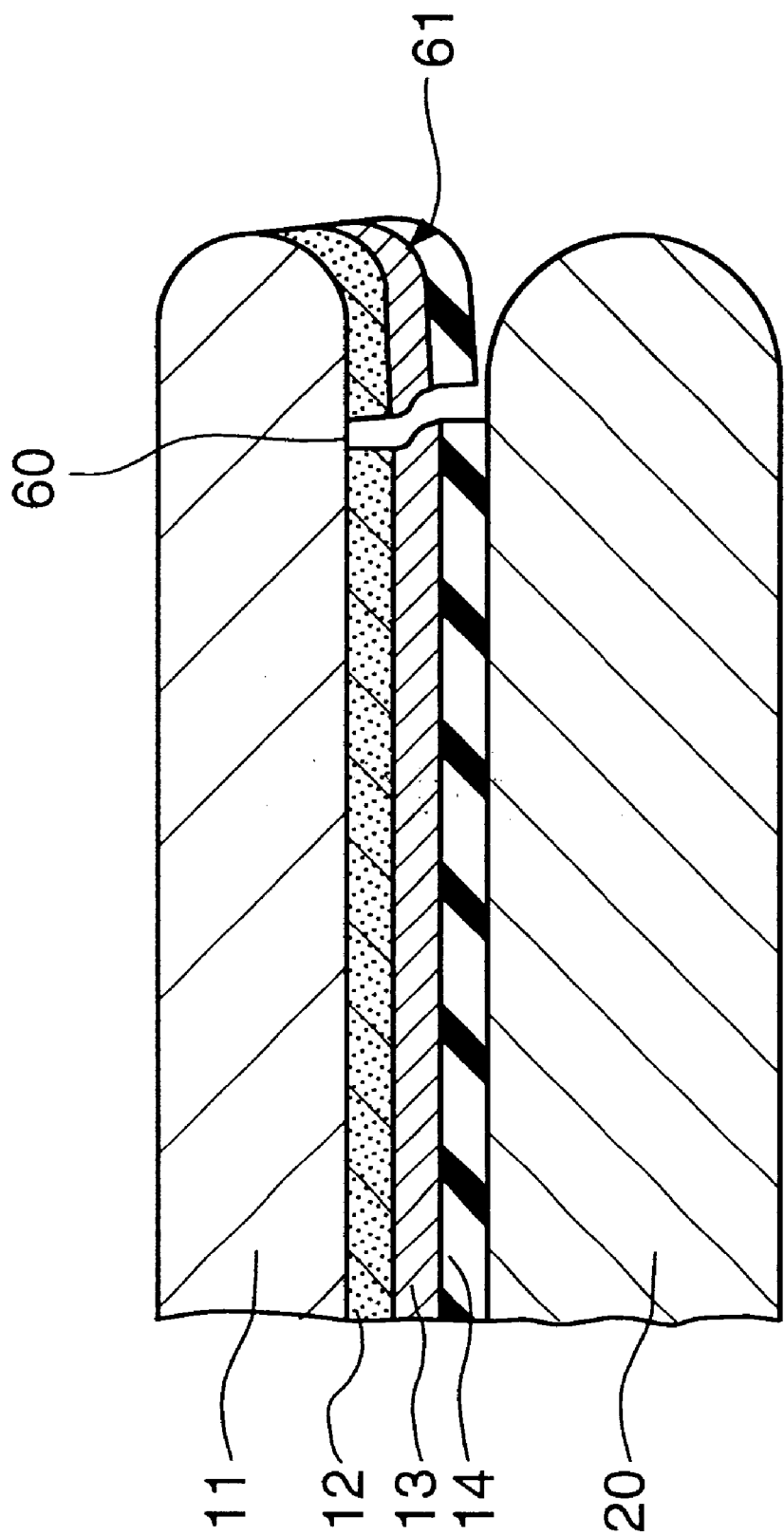
FIG. 6 is a view schematically showing the section of the bonded substrate stack having the separation start portion formed by a processing apparatus according to the preferred embodiment of the present invention.

FIG. 6 is a view showing the section of the composite member after the pre-separation process according to the embodiment of the present invention. FIG. 6 shows a state wherein the crack crossing the insulating layer 14 and single-crystal Si layer 13 reaches the porous layer 12 from the point of action 901 on the surface of the first member. A portion 61 at the end of (outside) the crack may be removed before the actual separation process. According to the embodiment of the present invention, the distance (L in FIG. 4) of the crack extending along the interface between the single-crystal Si layer 13 and the insulating layer 14 can be made zero or very short. More specifically, the distance between the outer edge portion of the substrate to the point where the crack reaches the porous layer can be 3 mm or less and, more preferably, 2 mm or less.

By the separation process (actual separation process) shown in FIG. 2E, a first substrate 10' after separation has a porous layer 12b on the single-crystal Si substrate 11. On the other hand, a second substrate 20' after separation has a multilayered structure of a porous Si layer 12c/single-crystal Si layer 13b/insulating layer 14b/single-crystal Si substrate 20.

With the above process, the single-crystal Si layer 13 and insulating layer 14 on the porous layer 12 of the first substrate can be transferred to the second substrate. The porous layer 12 is an example of the separation layer, and the single-crystal Si layer 13 and insulating layer 14 are an example of the transfer layer (surface layer) transferred from the first substrate to the second substrate.

Figure 2F:
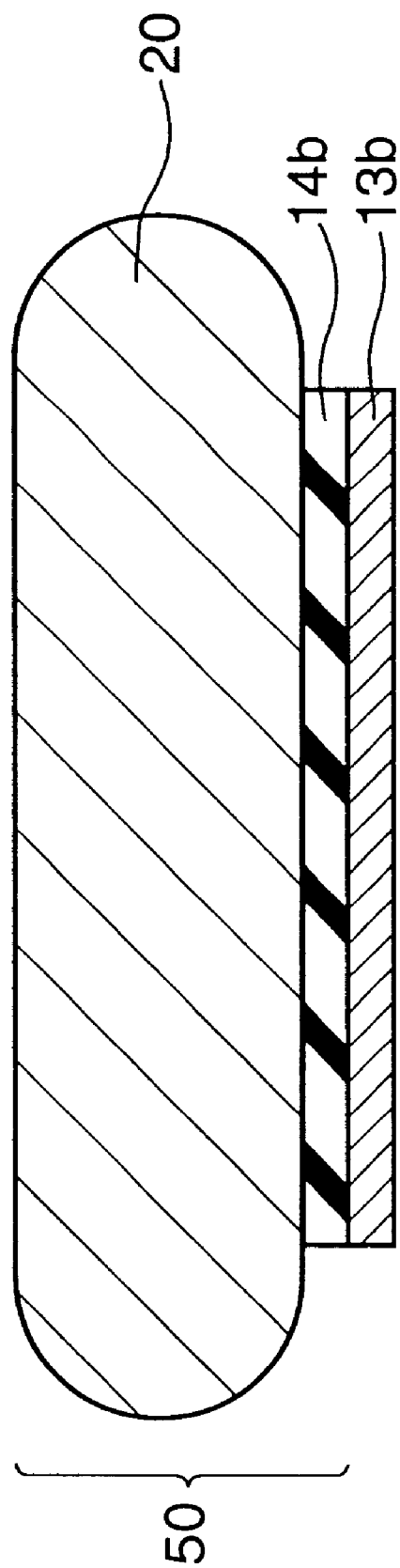
FIG. 2F is a schematic view for explaining the process of removing the porous layer on the second substrate side and an SOI substrate in the SOI substrate manufacturing method according to the preferred embodiment of the present invention.

In the step shown in FIG. 2F, the porous layer 12c on the surface of the second substrate 20 after separation is selectively removed, as needed. Thus, an SOI substrate 50 having a multilayered structure of the single-crystal Si layer 13b/insulating layer 14b/single-crystal Si substrate 20, i.e., the SOI layer (thin film) 13b is obtained, as shown in FIG. 2F.

Figure 2G:
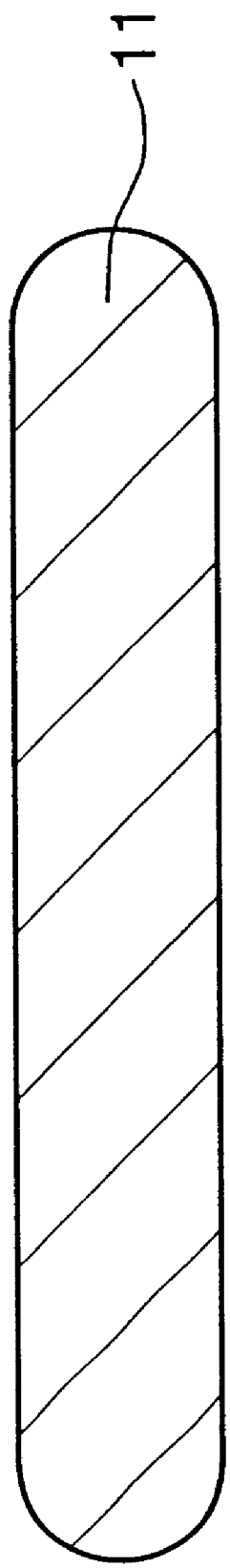
FIG. 2G is a schematic view for explaining the process of removing the porous layer on the first substrate side in the SOI substrate manufacturing method according to the preferred embodiment of the present invention.

In the step shown in FIG. 2G, the porous layer 12b on the single-crystal Si substrate 11 of the first substrate 10' after separation is selectively removed by etching or the like, as needed. The single-crystal Si substrate 11 thus obtained can be used again as a substrate for forming a first substrate 10 or as a second substrate 20.

As described above, according to the preferred embodiment of the present invention, a force asymmetric with respect to the bonding interface between the first and second substrates is applied to the end portion of the bonded substrate stack to form a separation start portion having a crack reaching the separation layer, and separation is executed from the separation start portion. Since the porous layer can be selectively broken, any serious defect can be prevented.

A processing apparatus suitably used to execute the process (pre-separation process) of forming the separation start portion of the present invention will be described next.

First Processing Apparatus

Figure 7:
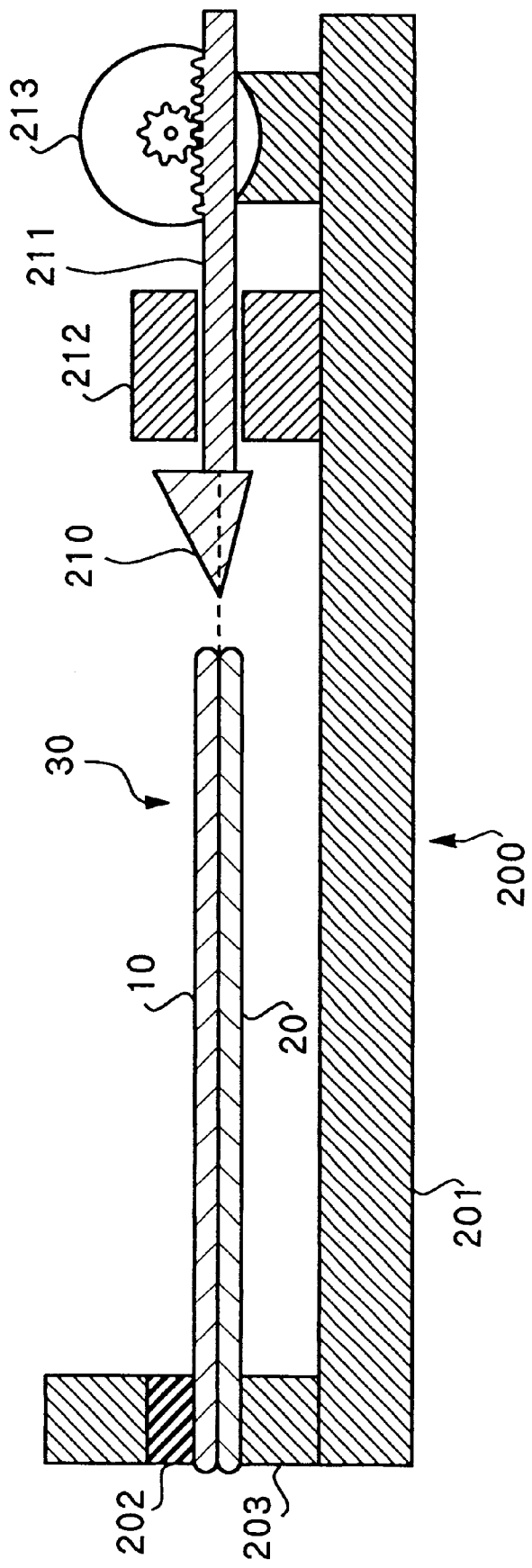
FIG. 7 is a view schematically showing the arrangement of a first processing apparatus suitable for execution of the pre-separation process.

FIG. 7 is a view schematically showing the arrangement of a first processing apparatus suitable for execution of the pre-separation process. A processing apparatus 200 shown in FIG. 7 has a support table 201 having a support portion 203 for supporting the bonded substrate stack 30, an elastic body 202 for pressing the bonded substrate stack 30 against the support portion 203, a wedge 210, a driving shaft 211 having a rack to reciprocally move the wedge 210, a guide member 212 for guiding the driving shaft 211, and a motor (driving section) 213 having a pinion gear to apply a driving force to the driving shaft 211 and reciprocally move the driving shaft 211.

To execute the pre-separation process, the motor 213 is rotated in the forward direction to insert the wedge 210 to the end portion of the bonded substrate stack 30 only by a predetermined amount. On the other hand, to retreat the wedge 210, the motor 213 is rotated in the reverse direction.

Figure 8:
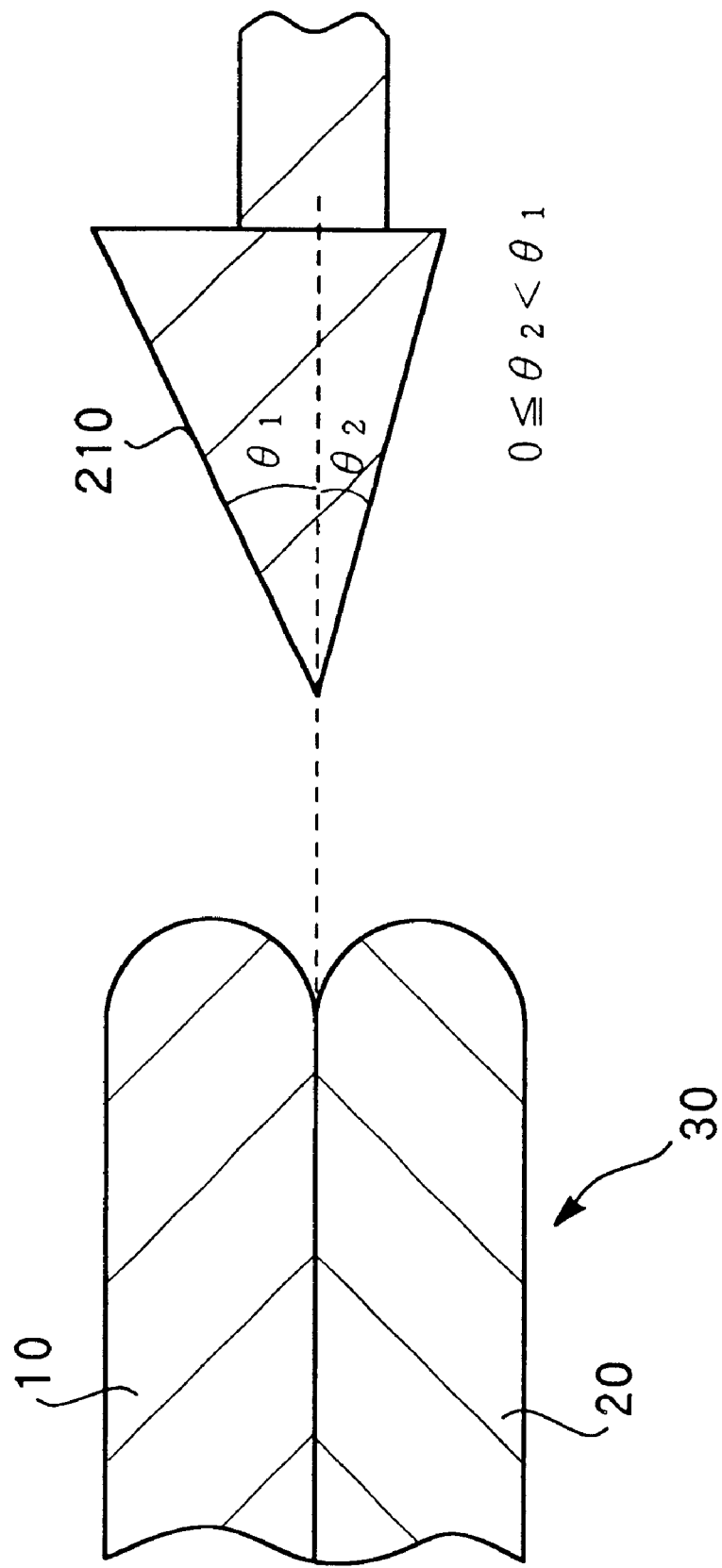
FIG. 8 is an enlarged view showing part of the arrangement shown in FIG. 7.

FIG. 8 is an enlarged view showing part of the arrangement shown in FIG. 7. The wedge 210 having an asymmetric structure has two butt surfaces with different tilt angles with respect to the bonding interface (a tilt angle θ1 on the side abutting against the first substrate 10 is larger than a tilt angle θ2 on the side abutting against the second substrate 20) as a structure for applying, to the first substrate 10 and second substrate 20, forces asymmetric with respect to the bonding interface between the first and second substrates 10 and 20, respectively. This asymmetric structure can generate a crack from the exposed portion of the first substrate 10 toward the porous layer inside to form an appropriate separation start portion.

Figure 9:
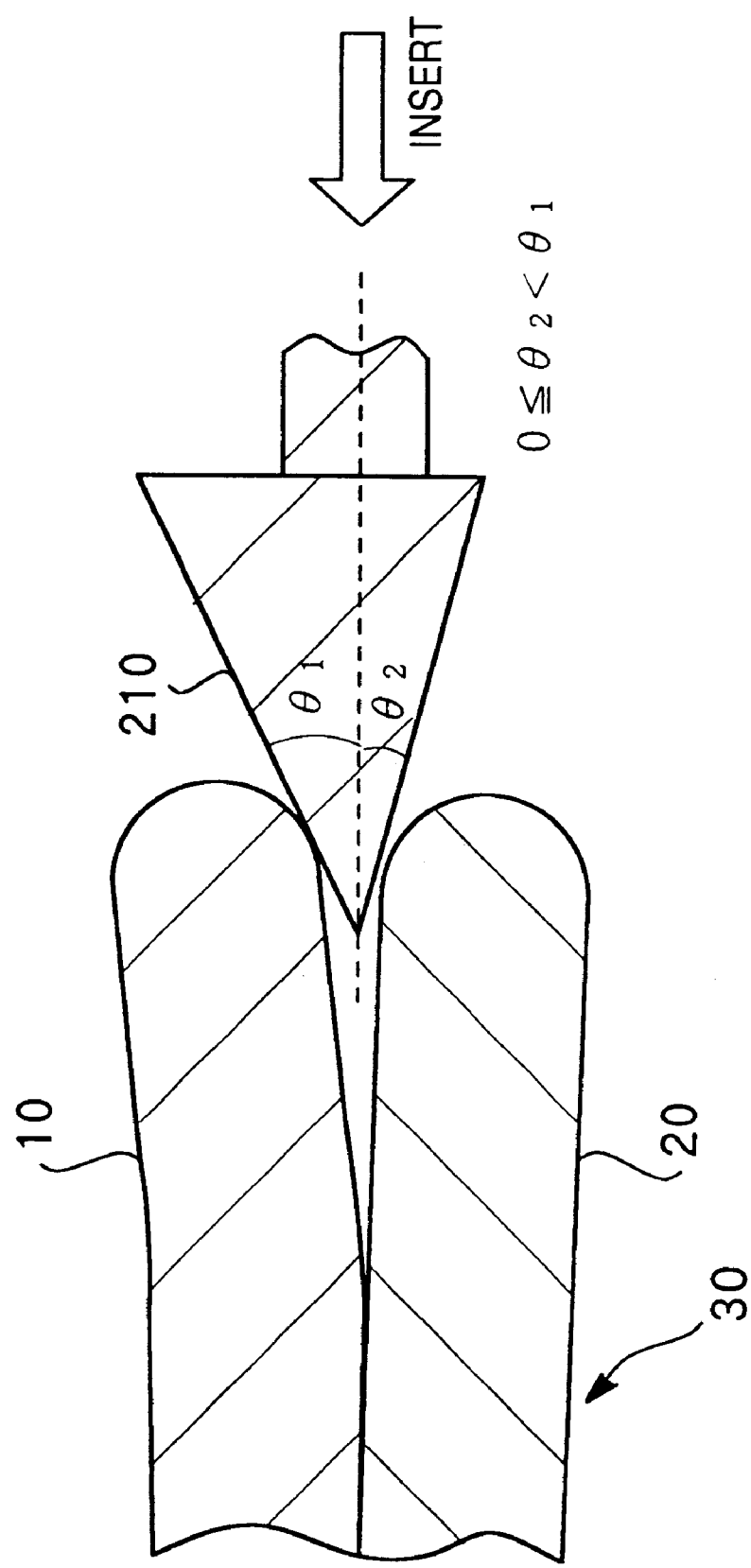
FIG. 9 is a view schematically showing a state in which a wedge is inserted to the end portion of the bonded substrate stack.

FIG. 9 is a view schematically showing a state in which the wedge 210 is inserted to the end portion of the bonded substrate stack 30. Since the wedge 210 has an asymmetric structure, the first substrate 10 and second substrate 20 receive forces asymmetric with respect to the bonding interface. FIG. 9 macroscopically illustrates the crack at the separation start portion. Actually, the crack includes a crack that reaches the separation layer through the transfer layer and a horizontal crack generated in the separation layer or in the interface on the upper or lower side of the separation layer, as described above.

Figure 10:
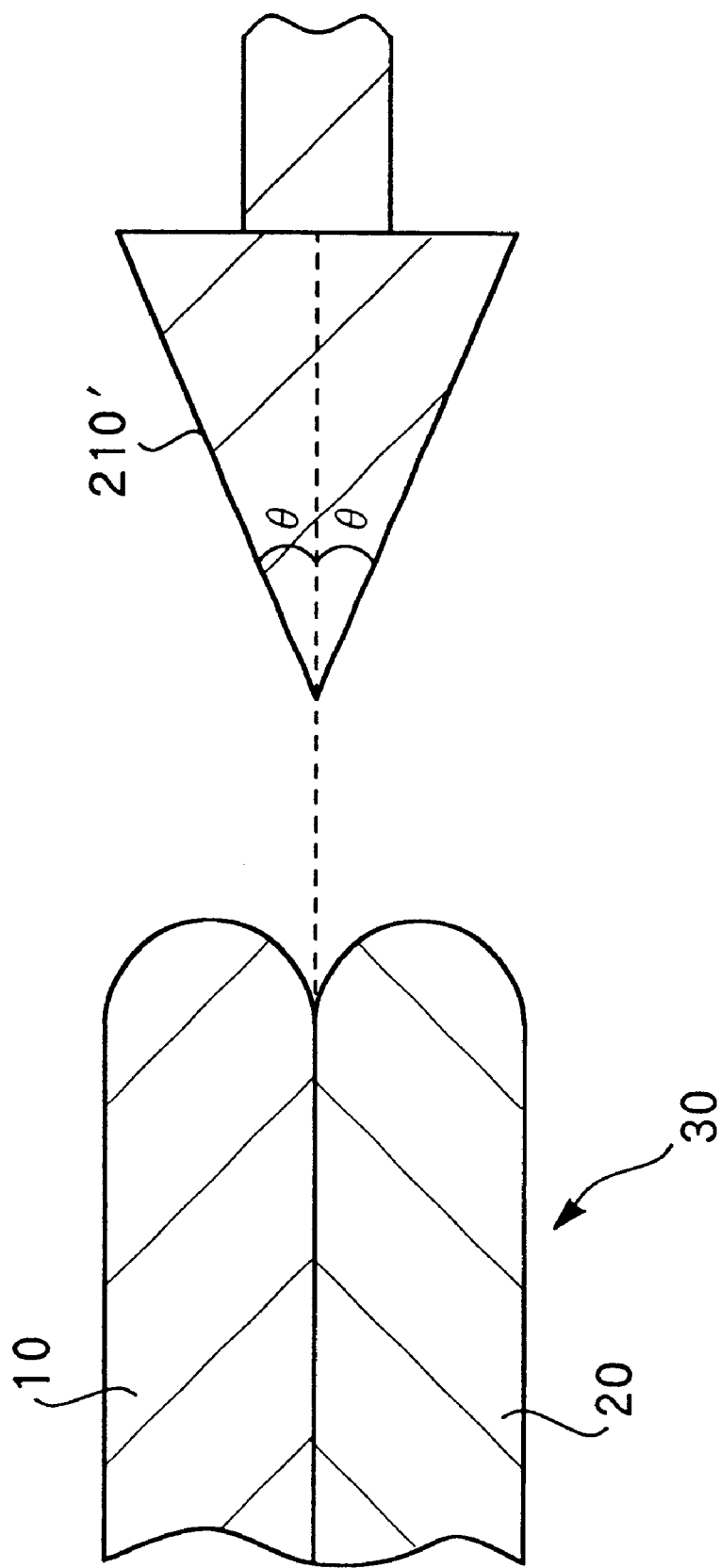
FIG. 10 is a view showing a wedge suitable for the actual separation process.

In the actual separation process, as shown in FIG. 10, a solid wedge 210' having a symmetric structure is preferably used. In this case, the processing apparatus shown in FIG. 7 is used in the pre-separation process, and the processing apparatus (processing apparatus having the wedge 210' in place of the wedge 210 of the processing apparatus shown in FIG. 7) shown in FIG. 10 is used in the actual separation process.

Second Processing Apparatus

Figure 11:
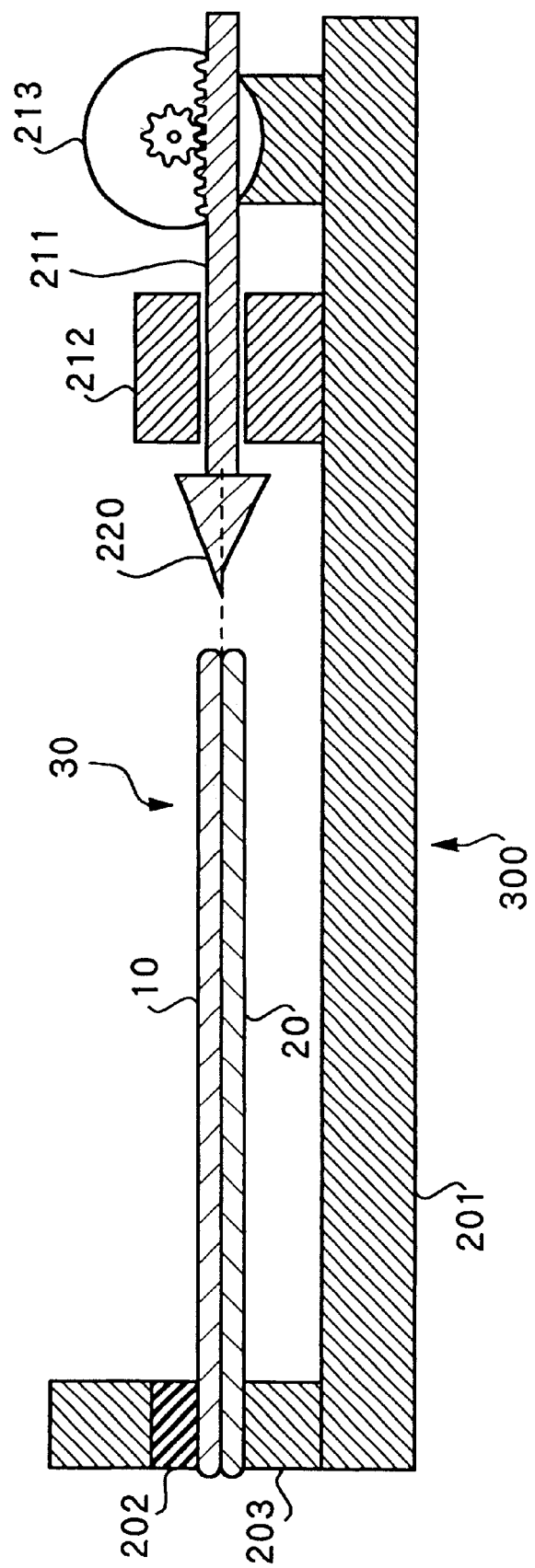
FIG. 11 is a view schematically showing the arrangement of a second processing apparatus suitable for execution of the pre-separation process.

FIG. 11 is a view schematically showing the arrangement of a second processing apparatus suitable for execution of the pre-separation process. A processing apparatus 300 shown in FIG. 11 has a support table 201 having a support portion 203 for supporting the bonded substrate stack 30, an elastic body 202 for pressing the bonded substrate stack 30 against the support portion 203, a wedge 220, a driving shaft 211 having a rack to reciprocally move the wedge 220, a guide member 212 for guiding the driving shaft 211, and a motor 213 having a pinion gear to apply a driving force to the driving shaft 211 and reciprocally move the driving shaft 211.

To execute the pre-separation process, the motor 213 is rotated in the forward direction to insert the wedge 220 to the end portion of the bonded substrate stack 30 only by a predetermined amount. On the other hand, to retreat the wedge 220, the motor 213 is rotated in the reverse direction.

Figure 12:
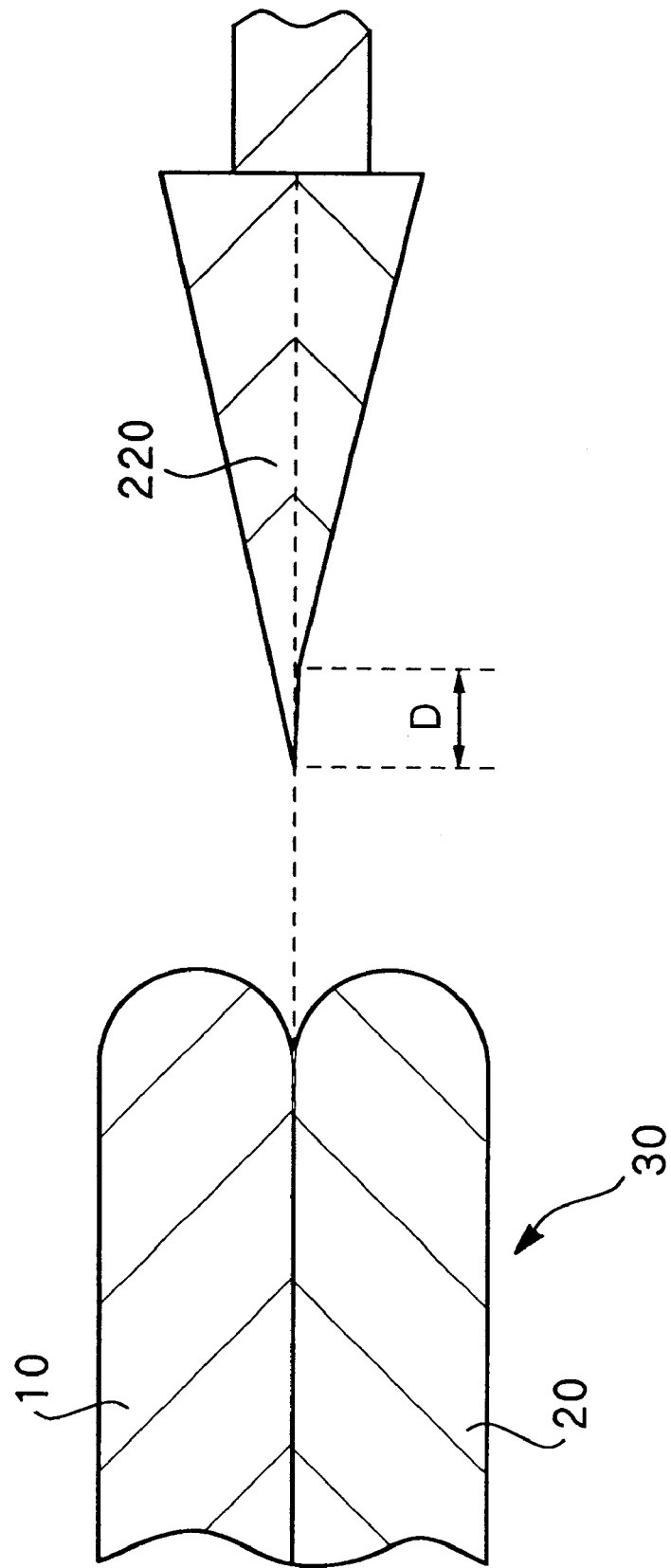
FIG. 12 is an enlarged view showing part of the arrangement shown in FIG. 11.

FIG. 12 is an enlarged view showing part of the arrangement shown in FIG. 11. The wedge 220 with an asymmetric structure has two butt surfaces which abut against the first and second substrates 10 and 20, respectively, as a structure for applying forces asymmetric with respect to the bonding interface between the first and second substrates 10 and 20 to them. The second butt surface which abuts against the second substrate 20 retreats from the first butt surface which abuts against the first substrate by a length D. This asymmetric structure can generate a crack from the exposed portion of the first substrate 10 toward the porous layer inside to form an appropriate separation start portion at the end portion of the bonded substrate stack 30.

Figure 13:
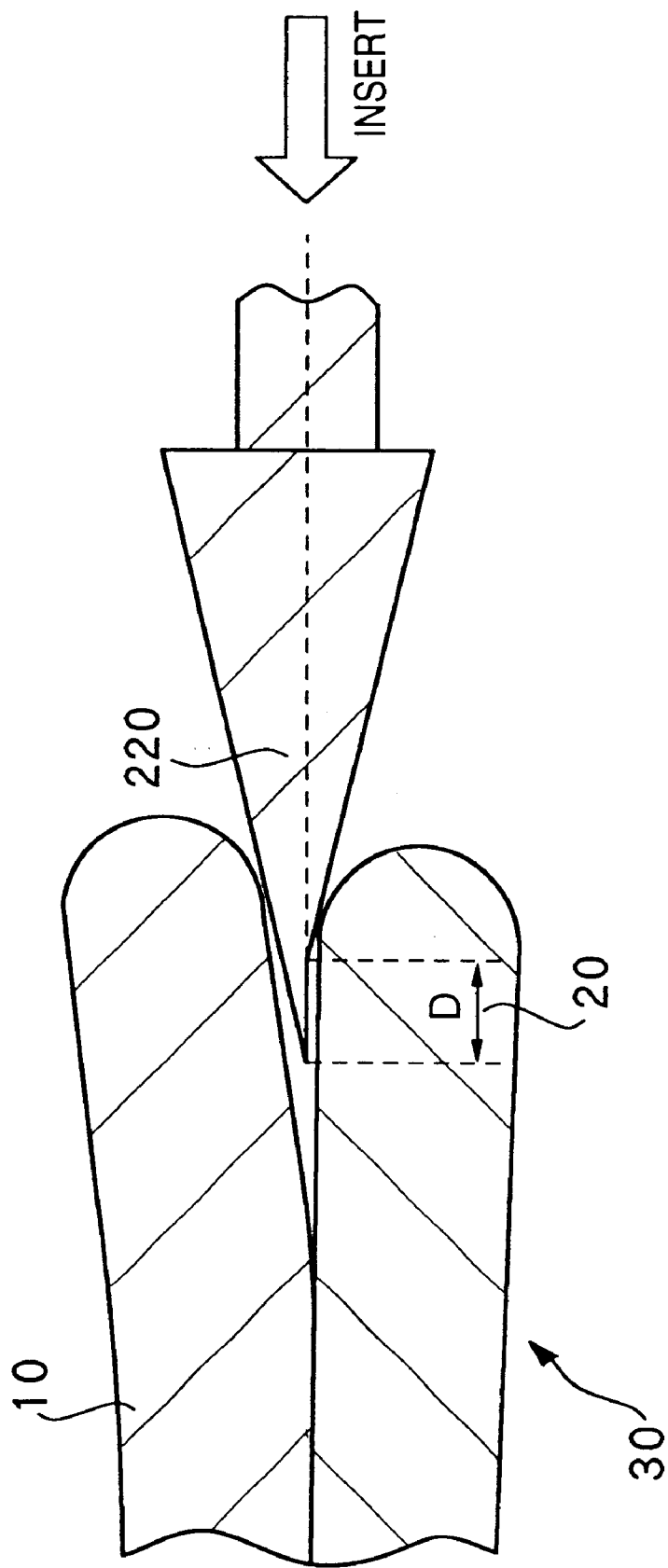
FIG. 13 is a view schematically showing a state in which a wedge is inserted to the end portion of the bonded substrate stack.

FIG. 13 is a view schematically showing a state in which the wedge 220 is inserted to the end portion of the bonded substrate stack 30. Since the wedge 220 has an asymmetric structure, the first substrate 10 and second substrate 20 receive forces asymmetric with respect to the bonding interface. FIG. 13 macroscopically illustrates the crack at the separation start portion. Actually, the crack includes a crack that reaches the separation layer through the transfer layer and a horizontal crack generated in the separation layer or in the interface on the upper or lower side of the separation layer, as described above.

In the actual separation process, as shown in FIG. 10, the solid wedge 210' having a symmetric structure is preferably used. In this case, the processing apparatus shown in FIG. 11 is used in the pre-separation process, and the processing apparatus (processing apparatus having the wedge 210' in place of the wedge 220 of the processing apparatus shown in FIG. 11) shown in FIG. 10 is used in the actual separation process.

Third Processing Apparatus

Figure 14:
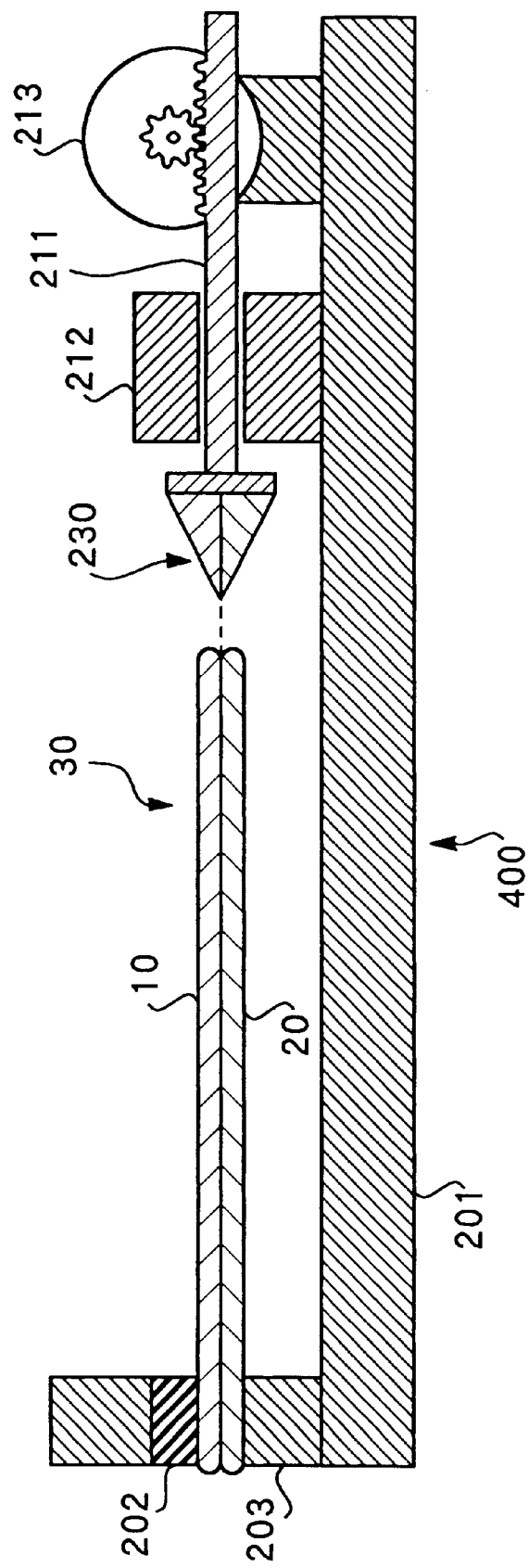
FIG. 14 is a view schematically showing the arrangement of a third processing apparatus suitable for execution of the pre-separation process.

FIG. 14 is a view schematically showing the arrangement of a third processing apparatus suitable for execution of the pre-separation process. A processing apparatus 400 shown in FIG. 14 has a support table 201 having a support portion 203 for supporting the bonded substrate stack 30, an elastic body 202 for pressing the bonded substrate stack 30 against the support portion 203, a wedge 230, a driving shaft 211 having a rack to reciprocally move the wedge 230, a guide member 212 for guiding the driving shaft 211, and a motor 213 having a pinion gear to apply a driving force to the driving shaft 211 and reciprocally move the driving shaft 211.

To execute the pre-separation process, the motor 213 is rotated in the forward direction to insert the wedge 230 to the end portion of the bonded substrate stack 30 only by a predetermined amount. On the other hand, to retreat the wedge 230, the motor 213 is rotated in the reverse direction.

Figure 15:
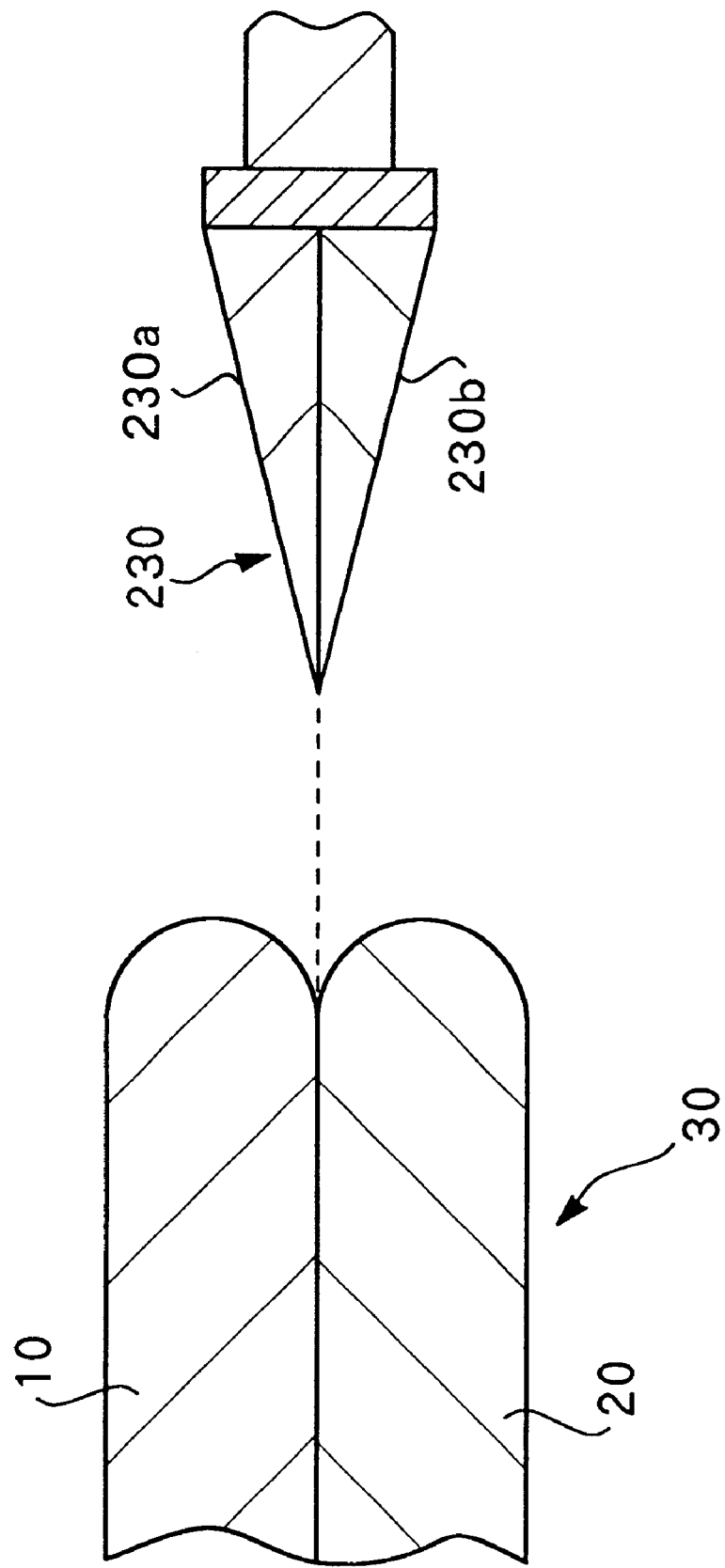
FIG. 15 is an enlarged view showing part of the arrangement shown in FIG. 14.

FIG. 15 is an enlarged view showing part of the arrangement shown in FIG. 14. The wedge 230 with an asymmetric structure has a structure for applying forces asymmetric with respect to the bonding interface between the first and second substrates 10 and 20 to them. More specifically, the wedge 230 has a first butt member 230a which abuts against the first substrate 10 and a second butt member 230b which abuts against the second substrate 20. The first butt member 230a has a hardness higher than that of the second butt member 230b. Typically, for example, the first butt member 230a is formed from a rigid body, and the second butt member 230b is formed from an elastic body (e.g., rubber). Thus, an appropriate separation start portion can be formed at the end portion of the bonded substrate stack 30.

Figure 16:
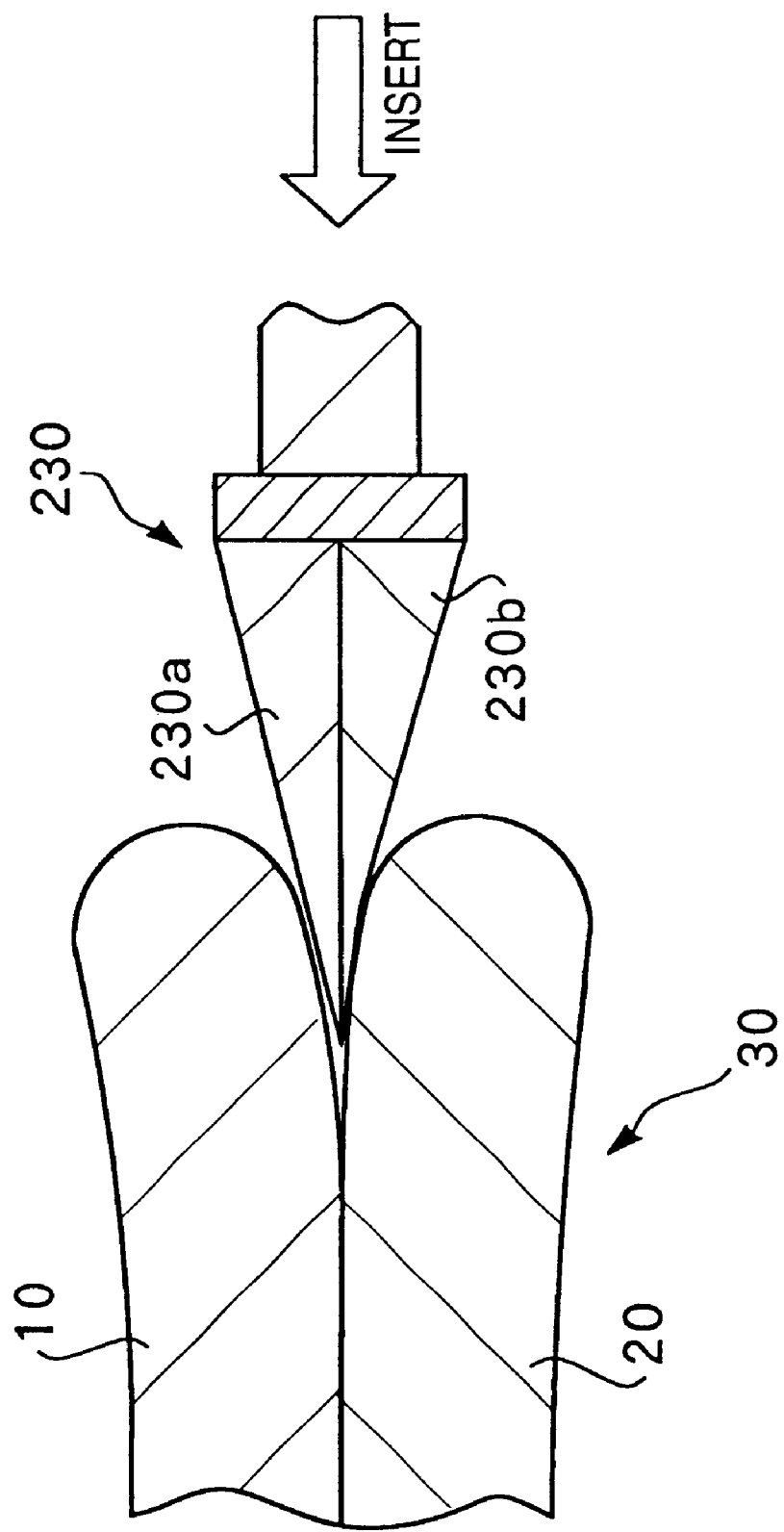
FIG. 16 is a view schematically showing a state in which a wedge is inserted to the end portion of the bonded substrate stack.

FIG. 16 is a view schematically showing a state in which the wedge 230 is inserted to the end portion of the bonded substrate stack 30. Since the wedge 230 has an asymmetric structure, the first substrate 10 and second substrate 20 receive forces asymmetric with respect to the bonding interface. FIG. 16 macroscopically illustrates the crack at the separation start portion. Actually, the crack includes a crack that reaches the separation layer through the transfer layer and a horizontal crack generated in the separation layer or in the interface on the upper or lower side of the separation layer, as described above.

In the actual separation process, as shown in FIG. 10, the solid wedge 210' having a symmetric structure is preferably used. In this case, the processing apparatus shown in FIG. 14 is used in the pre-separation process, and the processing apparatus (processing apparatus having the wedge 210' in place of the wedge 230 of the processing apparatus shown in FIG. 14) shown in FIG. 10 is used in the actual separation process.

Fourth Processing Apparatus

Figure 17:
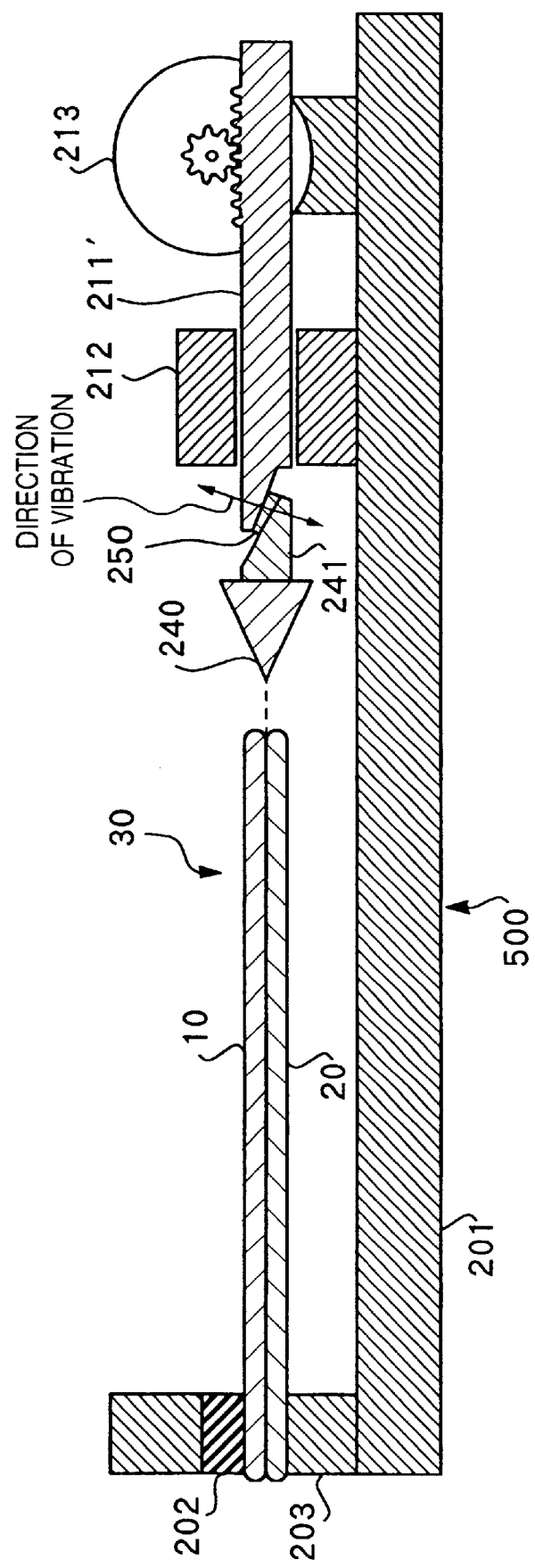
FIG. 17 is a view schematically showing the arrangement of a fourth processing apparatus suitable for execution of the pre-separation process.

FIG. 17 is a view schematically showing the arrangement of a fourth processing apparatus suitable for execution of the pre-separation process. A processing apparatus 500 shown in FIG. 17 has a support table 201 having a support portion 203 for supporting the bonded substrate stack 30, an elastic body 202 for pressing the bonded substrate stack 30 against the support portion 203, a wedge 240, a driving shaft 211' having a rack to reciprocally move the wedge 240, a guide member 212 for guiding the driving shaft 211', a motor 213 having a pinion gear to apply a driving force to the driving shaft 211' and reciprocally move the driving shaft 211', a vibration element 250 for vibrating the wedge 240 in a direction asymmetric with respect to the bonding interface between the first and second substrates 10 and 20, and a coupling member 241 for coupling one end of the vibration element 250 to the wedge 240.

The vibration element 250 generates a vibration in a direction asymmetric with respect to the bonding interface between the first and second substrates 10 and 20. As the vibration element 250, for example, an element (e.g., a piezoelectric element) for converting an electrical signal to a mechanical vibration energy is preferably used.

To execute the pre-separation process, the motor 213 is rotated in the forward direction to insert the wedge 240 to the end portion of the bonded substrate stack 30 only by a predetermined amount. On the other hand, to retreat the wedge 240, the motor 213 is rotated in the reverse direction.

Figure 18:
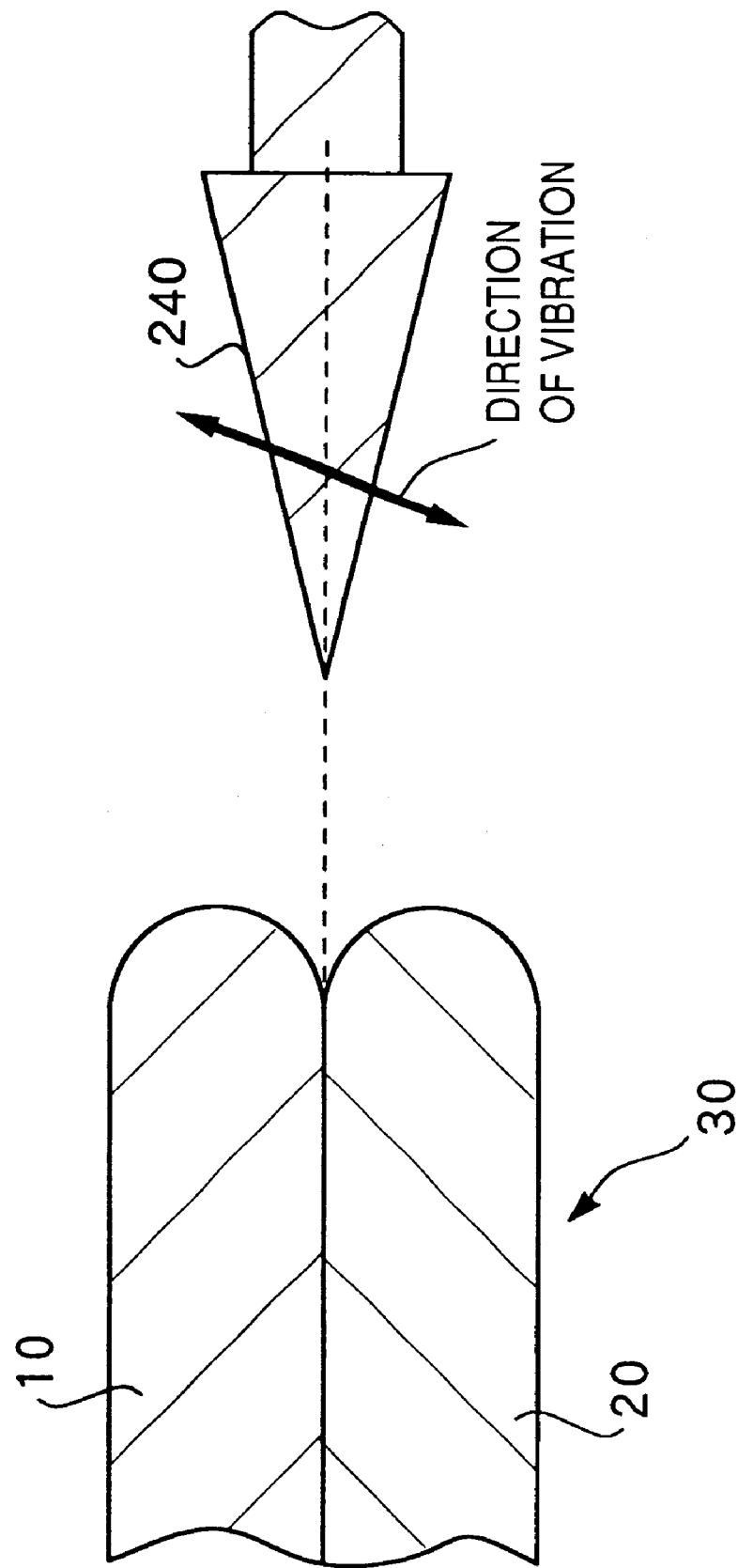
FIG. 18 is an enlarged view showing part of the arrangement shown in FIG. 17.

FIG. 18 is an enlarged view showing part of the arrangement shown in FIG. 17. The wedge 240 having an asymmetric structure receives, from the vibration element 250 shown in FIG. 17, a vibration in a direction asymmetric with respect to the bonding interface between the first substrate 10 and the second substrate. Thus, forces asymmetric with respect to the bonding interface are applied to the first and second substrates 10 and 20. More specifically, the first substrate 10 comes into contact with the wedge 240 due to this vibration at a portion outside the contact portion of the second substrate 20. For this reason, the moment received by the substrate 10 is larger than that received by the substrate 20, and the warp amount at the end portion of the substrate 10 is larger than that at the end portion of the substrate 20. This can generate a crack from the exposed portion of the first substrate 10 toward the porous layer inside to form an appropriate separation start portion at the end portion of the bonded substrate stack 30.

Figure 19:
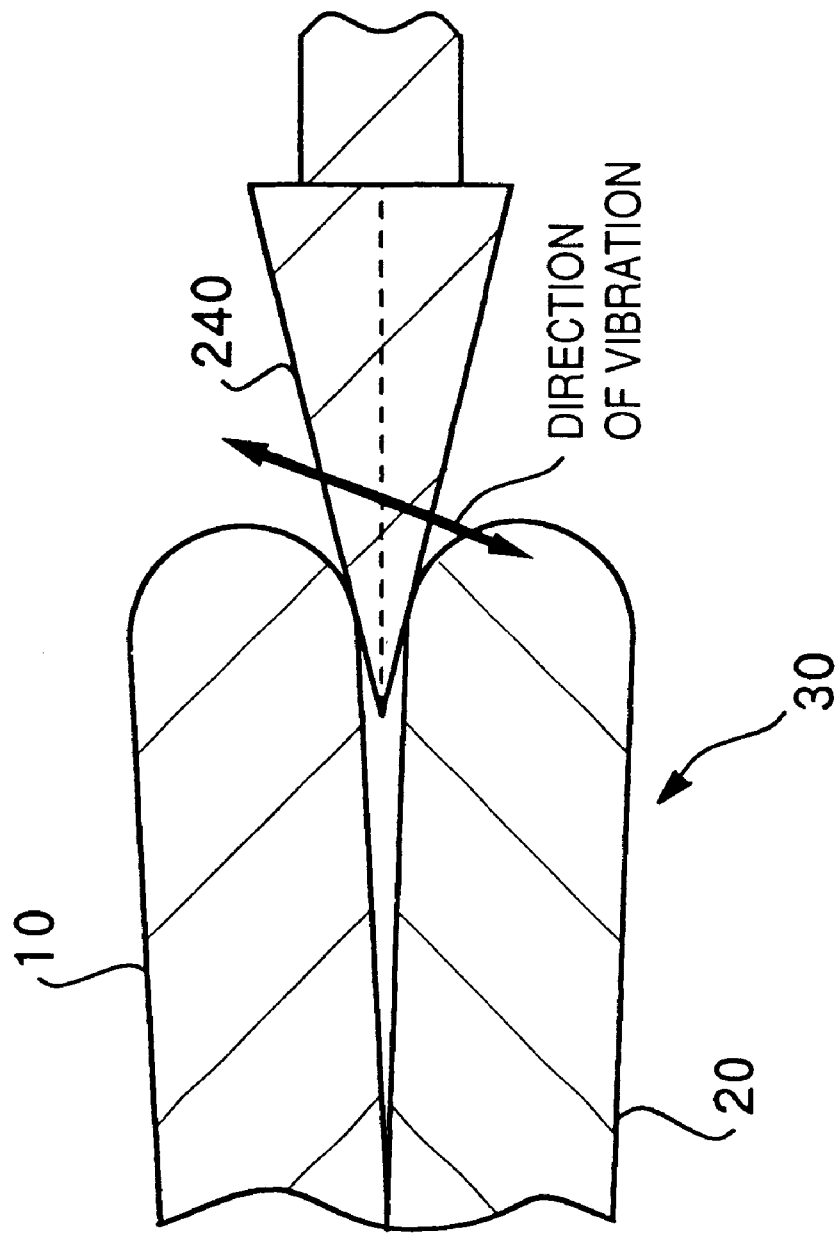
FIG. 19 is a view schematically showing a state in which a wedge is inserted to the end portion of the bonded substrate stack.

FIG. 19 is a view schematically showing a state in which the wedge 240 is inserted to the end portion of the bonded substrate stack 30. Since the wedge 240 vibrates in an asymmetric direction, the first substrate 10 and second substrate 20 receive forces asymmetric with respect to the bonding interface. FIG. 19 macroscopically illustrates the crack at the separation start portion. Actually, the crack includes a crack that reaches the separation layer through the transfer layer and a horizontal crack generated in the separation layer or in the interface on the upper or lower side of the separation layer, as described above.

When the vibration element 250 is stopped, this apparatus can be suitably used even in the actual separation process.

Fifth Processing Apparatus

Figure 20:
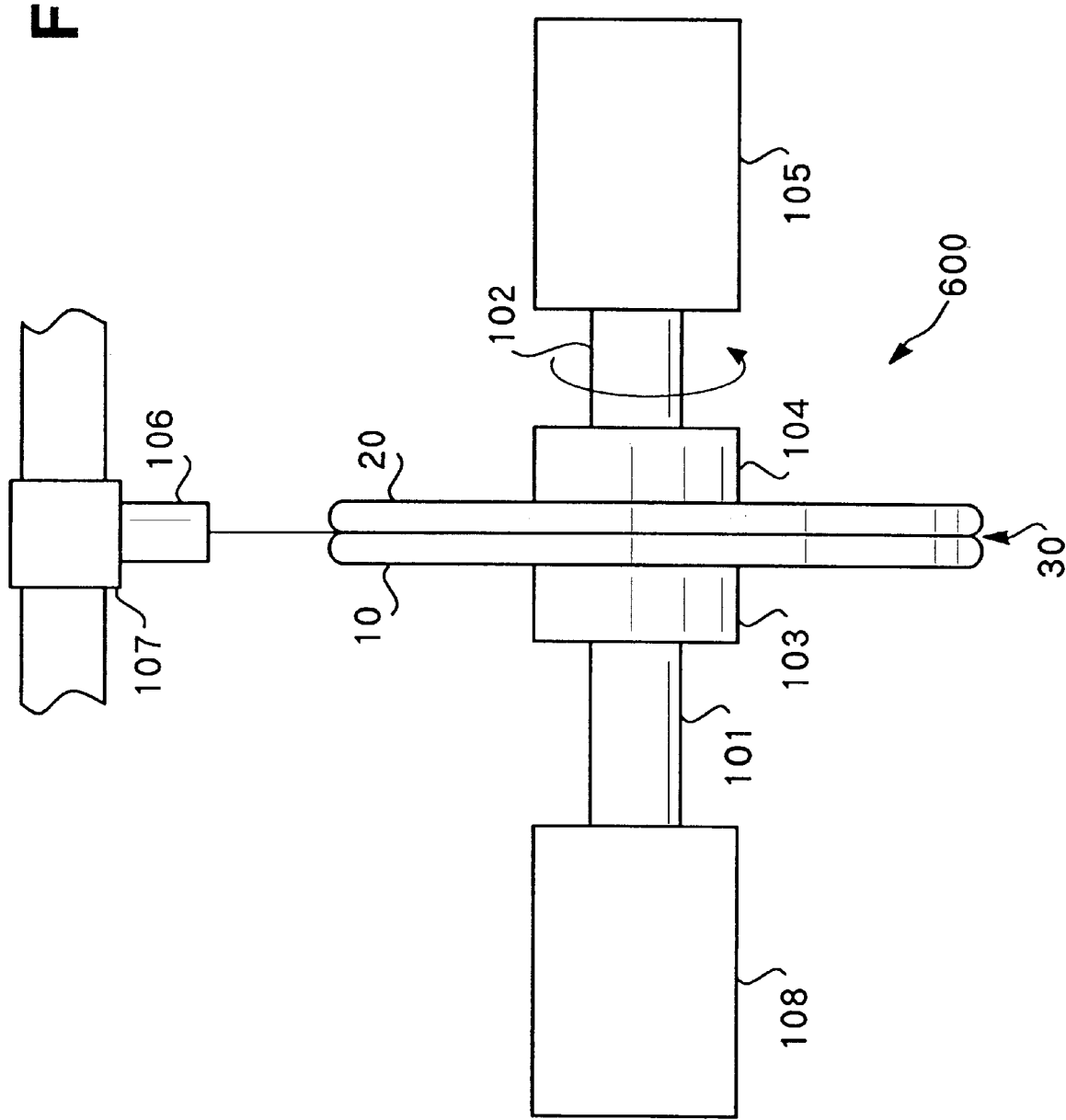
FIG. 20 is a view schematically showing the arrangement of a fifth processing apparatus suitable for execution of the actual separation process.

FIG. 20 is a view schematically showing the arrangement of a fifth processing apparatus suitable for execution of the actual separation process of the present invention. A processing apparatus 600 has a pair of substrate holding portions 103 and 104 for holding the bonded substrate stack 30, a rotating shaft 101 coupled to one substrate holding portion 103 and rotatably axially supported, an actuator (e.g., air cylinder) 108 coupled to the rotating shaft 101 to adjust the distance between the substrate holding portion 103 and the substrate holding portion 104 and press the bonded substrate stack 30, a rotating shaft 102 coupled to the other substrate holding portion 104 and rotatably axially supported, a rotation source (motor) 105 for rotating the rotating shaft 102, an ejection nozzle 106 for injecting a fluid into the bonded substrate stack 30, and a driving robot 107 for adjusting the relative positional relationship between the bonded substrate stack 30 and the ejection nozzle 106.

As a fluid, for example, a liquid such as water or a gas such as air or nitrogen can be employed. An apparatus using water as a fluid is generally called a water jet apparatus. The diameter of the ejection nozzle 106 is preferably, e.g., about 0.1 mm.

The ejection nozzle 106 is made to oppose the bonded substrate stack, and the driving robot 107 is driven to place the ejection nozzle 106 to a position almost immediately above the bonding interface between the first and second substrates 10 and 20 or a position shifted to the first substrate 10 side. In this state, a fluid is ejected from the ejection nozzle 106 to apply an external force symmetric or asymmetric with respect to the bonding interface between the first and second substrates 10 and 20 to the end portion of the bonded substrate stack 30. Thus, a crack can be formed and grown in the porous layer.

Another method may be employed to apply a force asymmetric with respect to the bonding interface to the end portion of the bonded substrate stack 30. For example, in the example shown in FIG. 20, the fluid is ejected parallel to the bonding interface. However, even when the fluid is tilted with respect to the bonding interface and ejected toward the first substrate, a crack can be formed and grown in the porous layer.

Sixth Processing Apparatus

Figure 21:
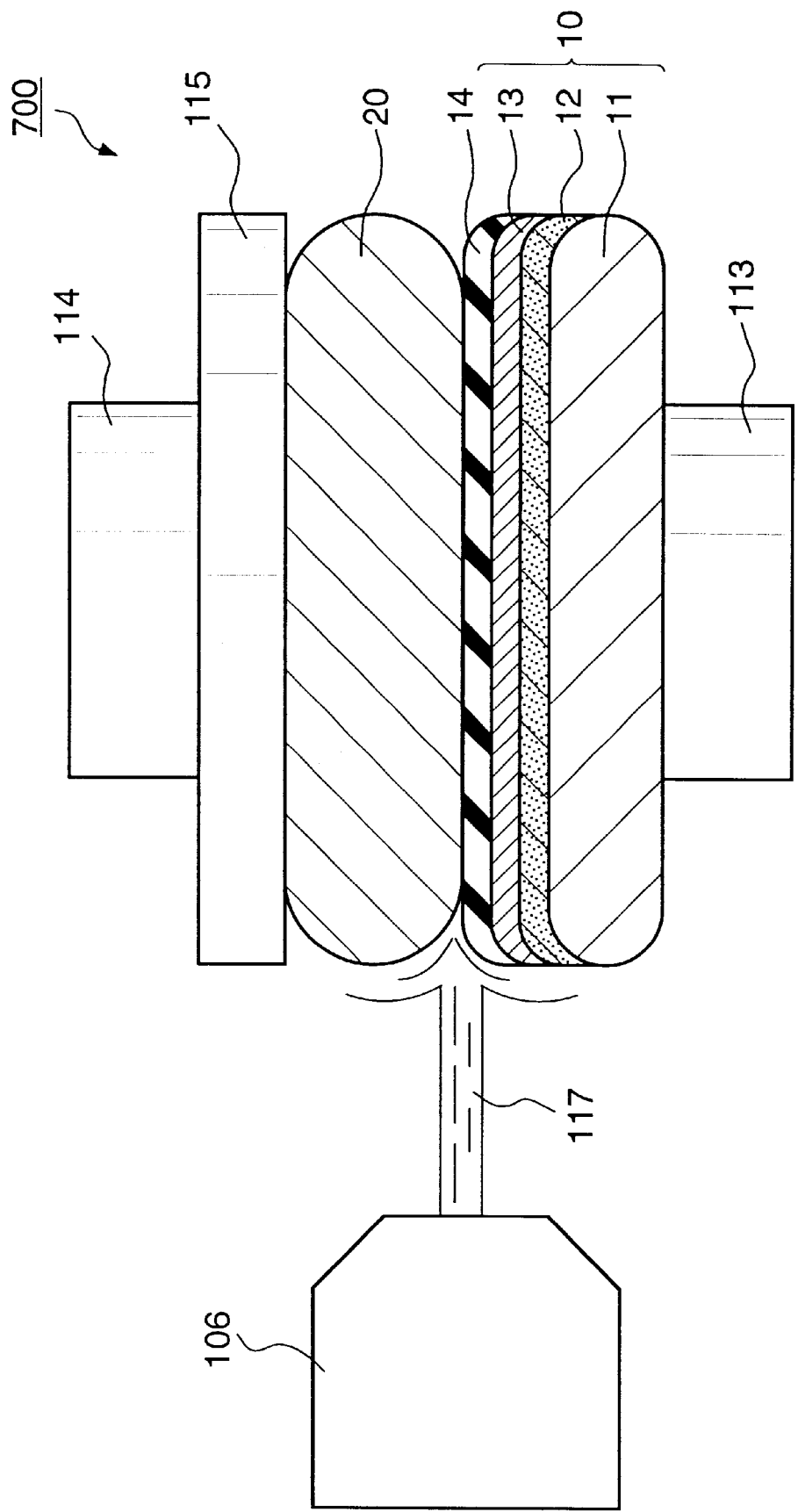
FIG. 21 is a view schematically showing the arrangement of a sixth processing apparatus suitable for execution of the pre-separation process or actual separation process.

FIG. 21 is a view schematically showing the arrangement of a sixth processing apparatus suitable for execution of the pre-separation process or actual separation process of the present invention.

A processing apparatus 700 shown in FIG. 21 has a pair of substrate holding portions 113 and 114 for rotatably holding the bonded substrate stack, and a substrate holding mechanism having an asymmetric structure with a warp correction member 115 coupled to one substrate holding portion 114. This substrate holding mechanism having an asymmetric structure applies a force asymmetric with respect to the bonding interface to the end portion of the bonded substrate stack.

The substrate 20 is chucked by the substrate holding portion 114 via the warp correction member 115 by vacuum chuck. The substrate 10 is chucked by the substrate holding portion 113 by vacuum chuck. When the substrate holding portion 114 (or substrate holding portion 113) is rotated, the bonded substrate stack and substrate holding portion 113 (or substrate holding portion 114) rotate together.

This processing apparatus 700 is used in the following way. First, the bonded substrate stack is sandwiched and held between the substrate holding portions 113 and 114. The bonded substrate stack is not rotated but stands still, and a fluid 117 such as pure water, air, or nitrogen is ejected to the bonding interface of the bonded substrate stack or a portion nearby. At this time, the second substrate 20 is prevented from warping upward in FIG. 21 by the plate-shaped warp correction member 115. On the other hand, on the first substrate 10 side, since no warp correction member is present, the outermost edge of the member supporting the substrate is located inside that for the second substrate 20.

Hence, the end portion of the first substrate 10 readily warps as compared to the second substrate 20.

In this state, when the fluid 117 is ejected to recessed portions formed by the beveling portions of the first and second substrates, the end portions of the two substrates receive a separation force from the fluid. By the action of the force as shown in FIG. 5, a crack is formed from the surface of the first substrate to the separation layer, as shown in FIG. 6 or the like.

After that, the substrate holding portion 114 is rotated while continuously ejecting the fluid 117. Thus, the bonded substrate stack rotating is gradually separated by the fluid 117. The pressure in the compressor for supplying the fluid to the ejection nozzle 106 is adjusted such that the bonded substrate stack is completely separated at a timing when the bonded substrate stack has rotated by one revolution or more. In this separation processing, the crack is spirally formed from the outer edge of the substrate to the center.

When the two substrates are completely separated, ejection of the fluid is stopped.

Seventh Embodiment

Figure 22:
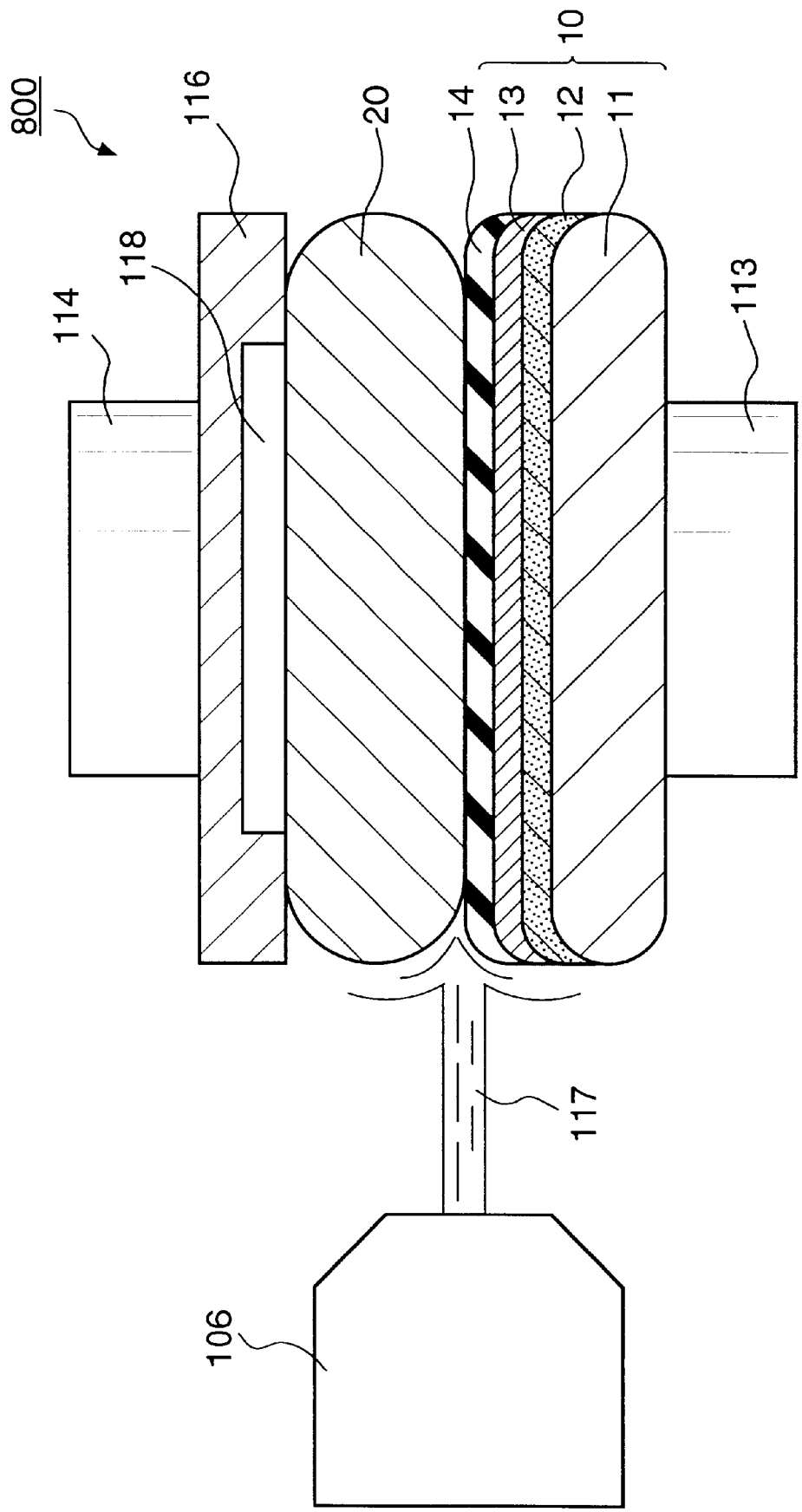
FIG. 22 is a view schematically showing the arrangement of a seventh processing apparatus suitable for execution of the pre-separation process or actual separation process.

FIG. 22 is a view schematically showing the arrangement of a seventh processing apparatus suitable for execution of the pre-separation process or actual separation process.

A processing apparatus 800 shown in FIG. 22 has a pair of substrate holding portions 113 and 114 for rotatably holding the bonded substrate stack, and an asymmetric substrate holding mechanism having a concave warp correction member 116 for chucking the substrate 20 only at the end portion. Reference numeral 118 denotes a recessed portion (space) 118. The substrate holding mechanism having an asymmetric structure applies a force asymmetric with respect to the bonding interface to the end portion of the bonded substrate stack.

The substrate 20 is chucked at the end portion of the by the chuck member 116 by vacuum chuck. The substrate 10 is chucked by the substrate holding portion 113 by vacuum chuck. When the substrate holding portion 114 (or substrate holding portion 113) is rotated, the bonded substrate stack and substrate holding portion 113 (or substrate holding portion 114) rotate together.

The operation of this apparatus is the same as that of the apparatus shown in FIG. 21.

Eighth Processing Apparatus

Figure 23:
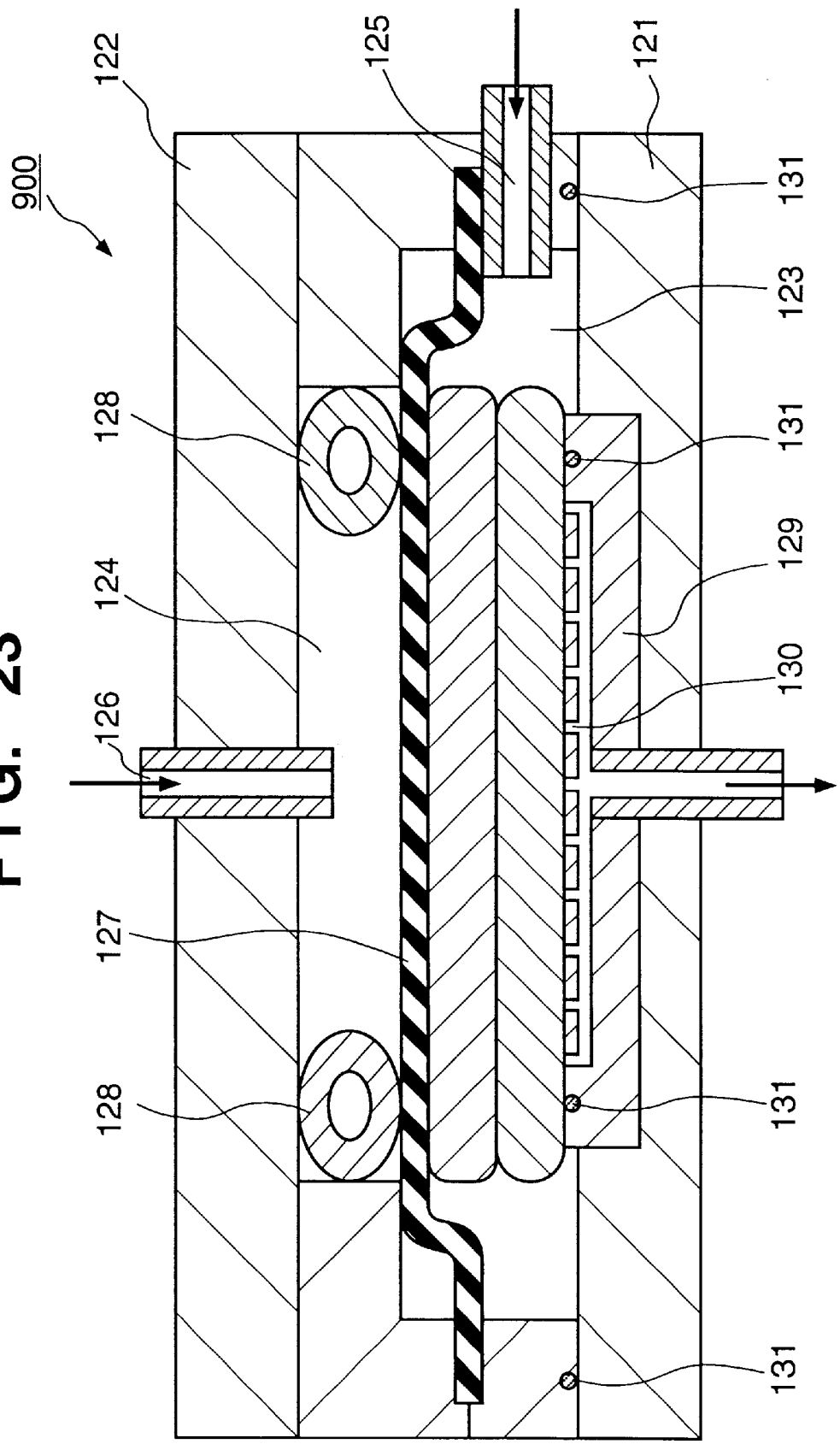
FIG. 23 is a view schematically showing the arrangement of an eighth processing apparatus suitable for execution of the pre-separation process or actual separation process.

FIG. 23 is a view schematically showing the arrangement of an eighth processing apparatus suitable for execution of the pre-separation process or actual separation process. A processing apparatus 900 has an asymmetric substrate holding mechanism. The substrate holding mechanism having an asymmetric structure applies a force asymmetric with respect to the bonding interface to the end portion of the bonded substrate stack.

A processing apparatus 900 shown in FIG. 23 has a lower lid 121 and upper lid 122, and a space 123 and another space 124 for accommodating the bonded substrate stack inside.

A fluid supply pipe 125 communicates with one space 123, and a fluid supply pipe 126 communicates with the other space 124 to independently supply a fluid at desired pressures. A sheet-like partition sealing member 127 formed from an elastic body such as rubber is attached inside the processing apparatus 900, thereby partitioning the space 123 from the space 124. A hollow O-ring 128 is provided in the space 124 on the upper lid 122 side. The sealing member 127 also functions as a holding portion for the substrate 10.

The lower lid 121 has a substrate holding portion 129 for holding the substrate 20. The substrate holding portion 129 has a plurality of suction holes 130 for vacuum chuck. An O-ring 131 for vacuum sealing is attached to the outer peripheral portion of the substrate holding portion 129.

The processing apparatus 900 is used in the following manner. First, the upper and lower lids 122 and 121 are opened, and the bonded substrate stack is placed on the substrate holding portion 129 and chucked through the suction holes 130. Next, the upper and lower lids 122 and 121 are closed to hermetically seal the space 123, and a pressurized fluid is supplied for the fluid supply pipe 125 into the space 123. Simultaneously, a pressurized fluid is supplied from the fluid supply pipe 126 into the space 124.

The pressure in the space 123 is made higher than that in the space 124. The upper substrate 10 of the bonded substrate stack is vertically movably in tight contact with the sealing member 127. For this reason, when the end portion of the substrate 10 receives static pressure from the fluid, the end portion of the substrate 10 warps upward by the action of force as shown in FIG. 5. Thus, a crack is generated from the surface of the first substrate 10 to the separation layer, as shown in FIG. 6 or the like.

After that, when the static pressure is continuously applied using the fluid, the bonded substrate stack is completely separated.

Figure 24:
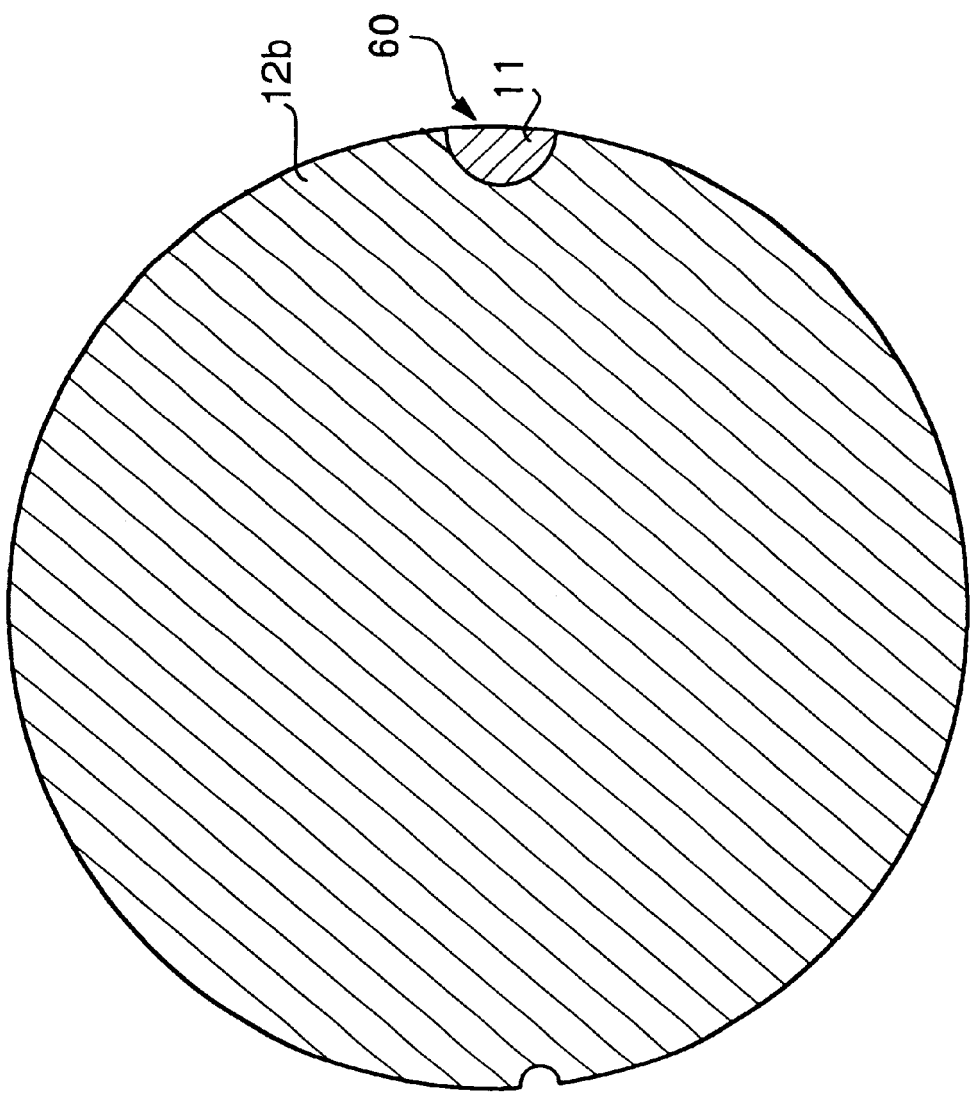
FIG. 24 is a schematic plan view showing an example of the first substrate after separation of the composite member according to the embodiment of the present invention.

FIG. 24 is a schematic plan view showing an example of the first substrate after separation of the composite member according to the embodiment of the present invention.

Except the separation start portion 60, the porous 12b having a uniform thickness remains across a large area on the separation surface side of the first substrate 11. When the distance between the position of the semi-spherical separation start portion 60 and the outer edge portion of the substrate is 3 mm or less and, more preferably, 2 mm or less, a satisfactory SOI substrate can be obtained.

According to the embodiment of the present invention, a crack reaching the separation layer can be stably generated at a position separated from the outer edge portion of the substrate by 3 mm or less and, more preferably, 2 mm or less.

In the present invention, the pre-separation process is preferably executed without rotating the bonded substrate stack to prevent the area of the separation start portion 60 from undesirably increasing.

After the pre-separation process, the fluid is ejected to the end portion of the bonded substrate stack while rotating the substrate. The crack does not grow until the fluid hits against a portion near the separation start portion 60. When the fluid hits against a portion near the separation start portion 60, the process shifts to the actual separation process. The actual separation process using a fluid is preferably executed by spirally growing the crack from the outer edge side to the center while driving the rotation source 105 by rotating the bonded substrate stack 30 by one or more revolutions and, more preferably, two or more revolutions. This suppresses warp of the substrate during the actual separation process and properly prevents break of the substrate itself.

An embodiment of a thin film manufacturing method using ion implantation will be described with reference to FIGS. 25A to 25E.

First, a substrate such as a single-crystal Si wafer is prepared. A substrate having a single-crystal semiconductor layer 13 epitaxially grown on a mirror wafer is preferably used.

Next, annealing is performed in an oxidation atmosphere to form an insulating layer 14 such as a silicon oxide film on the surface of a substrate 11.

Ions are implanted into the substrate 11 through the surface of the substrate 11 having the insulating layer 14 by linear ion implantation or plasma immersion ion implantation. At this time, the energy for ion implantation is controlled in accordance with the thickness of the transfer layer such that the implanted particles have a peak concentration at a depth corresponding to the thickness of the transfer layer.

The layer portion where the implanted particles are distributed at a high concentration serves as a separation layer 4 because stress or defects are generated by the implanted ions.

Figure 25A:
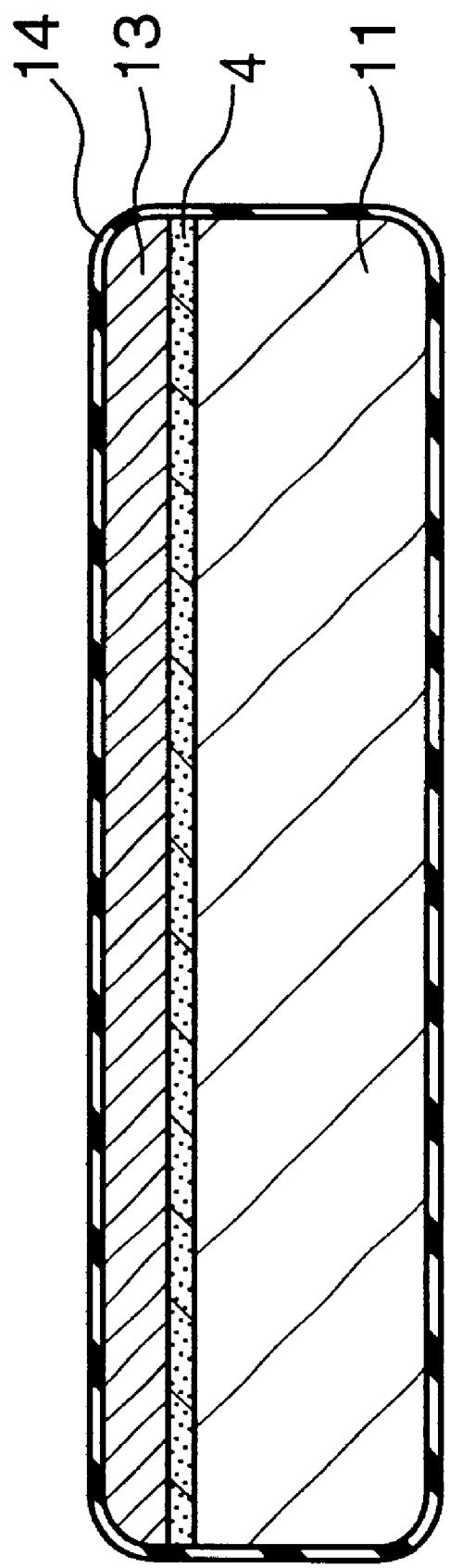

Thus, a first member having the insulating layer 14 and single-crystal semiconductor layer 13 as a transfer layer and the separation layer 4 formed by ion implantation under the transfer layer is manufactured (FIG. 25A).

Next, a second member 20 such as a silica glass or single-crystal silicon wafer is prepared, and an insulating layer such as a silicon oxide film is formed on the surface of the second member, as needed.

Figure 25B:
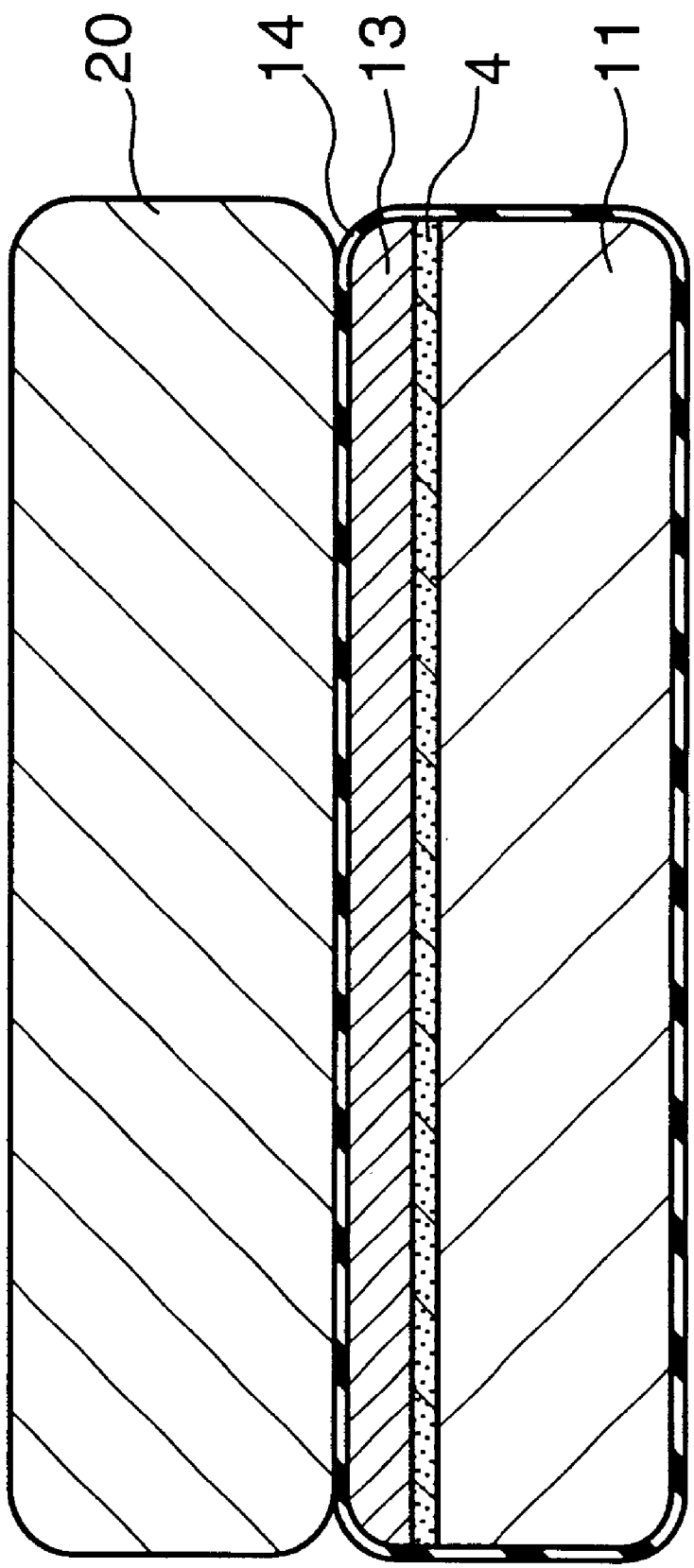

The first member and second member 20 are brought into tight contact and bonded at room temperature. Annealing is preferably executed, as needed, to increase the bonding strength. Thus, a composite member shown in FIG. 25B is obtained.

Figure 25C:
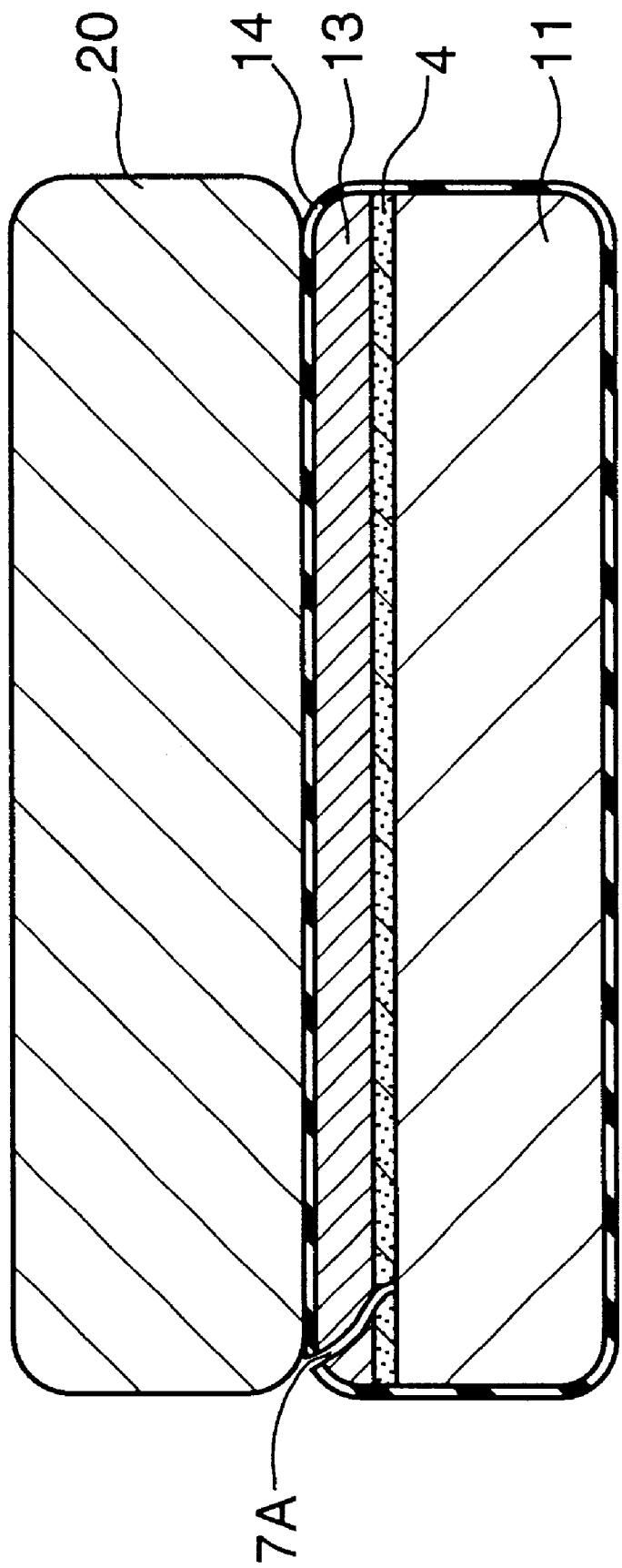

The above-described asymmetric external force is applied to the composite member to form a crack 7A running from the surface of the first member to the separation layer 4 through the insulating layer 14 and single-crystal semiconductor layer 13 as a transfer layer (FIG. 25C).

A separation force is applied to grow a crack 7B along the separation layer 4 in the horizontal direction in FIG. 25D (FIG. 25D).

Figure 25E:
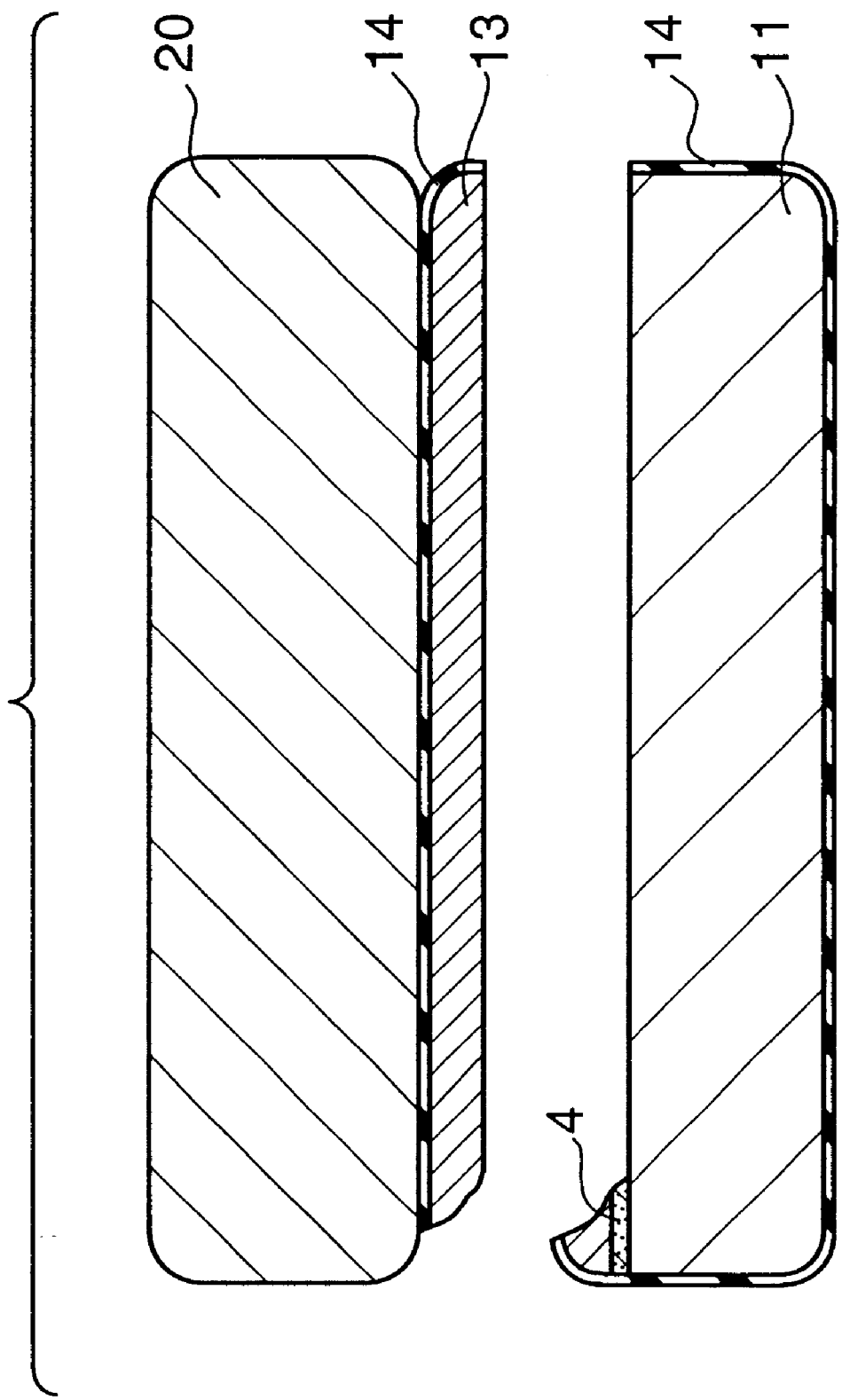

Thus, the composite member is completely separated, as shown in FIG. 25E, so the insulating layer 14 and single-crystal semiconductor layer 13 are transferred onto the second member.

With the above process, a thin film (single-crystal semiconductor layer 13) as an SOI layer can be manufactured.

Preferred examples of the present invention will be described below.

EXAMPLE 1

In Example 1, a first processing apparatus 200 and fifth processing apparatus 600 were applied to an SOI substrate manufacturing process.

First, to form a first substrate 10, a p-type (or n-type) single-crystal Si substrate 11 having a resistivity of 0.01 $\Omega \cdot cm$ was prepared and subjected to two-step anodizing in an HF solution, thereby forming a porous Si layer 12 made of two porous layers with different porosities on the substrate surface (FIG. 2A). The anodizing conditions were as follows.

<First Anodizing Conditions>
 Current density: 7 ($mA \cdot cm^2$)
 Anodizing solution: $HF:H_2O: C_2H_5OH=1:1:1$
 Process time: 5 (min)
 Porous Si thickness: 4.5 ($\mu m$)
<Second Anodizing Conditions>
 Current density: 30 ($mA \cdot cm^2$)
 Anodizing solution: $HF:H_2O:C_2H_5OH=1:1:1$
 Process time: 10 (sec)
 Porous Si thickness: 0.2 ($\mu m$)

Thus, a first porous layer having a low porosity was formed on the surface side of the first substrate at the low current in the first step, and a second porous layer which had a thickness and porosity more than those of the first porous layer was formed under the first porous layer at the high current in the second step.

The thickness of the first porous layer is not limited to the above example and is preferably, e.g., several hundred to 0.1 $\mu m$. The thickness of the second porous layer is not limited to the above example, either, and can be appropriately changed in accordance with conditions of the subsequent separation process.

The above conditions were determined such that the first porous layer had a porosity suitable for formation of a high-quality epitaxial Si layer 13, and the second porous layer had a porosity at which a crack was generated at a portion very close to the interface to the first porous layer in the second porous layer.

The porous layer 12 may be formed from one layer or three or more layers.

Next, this substrate was oxidized in an oxygen atmosphere at 400° C. for 1 hr. With this oxidation, the inner walls of pores in the porous layer were covered with thermal oxide films while maintaining the single-crystal Si structure in the porous layer.

A 0.3-$\mu m$ thick single-crystal Si layer 13 was epitaxially grown on the porous Si layer 12 by CVD (Chemical Vapor Deposition) (FIG. 2B). The growth conditions were as follows. At the early stage of epitaxial growth, the surface of the porous Si layer 12 was exposed to hydrogen gas at high temperature. Hence, holes on the surface were filled by migration of Si atoms to form a flat surface.

<Epitaxial Growth Conditions>
 Source gas: $SiH_2Cl_2/H_2$
 Gas flow rate: 0.5/180 (l/min)
 Gas pressure: 80 (Torr)
 Temperature: 950 (° C.)
 Growth rate: 0.30 ($\mu m/min$)

A 200-nm thick $SiO_2$ layer 14 was formed on the surface of the epitaxially grown single-crystal Si layer 13 by thermal oxidation (FIG. 2B). With this process, the first substrate 10 was obtained.

An Si substrate (second substrate) 20 having the same size as that of the first substrate 10 was separately prepared and brought into tight contact with the surface of the $SiO_2$ layer 14 of the first substrate 10 while matching the central positions of the two substrates. The resultant structure was annealed in an oxidation atmosphere at 1,180° C. for 5 min. With this process, a bonded substrate stack 30 as shown in FIG. 2C was formed. Actually, the surface of the composite member was covered with an oxide film by annealing in the oxidation atmosphere.

As shown in FIG. 7, the outer peripheral portion of the bonded substrate stack 30 was supported by a support portion 203 of the processing apparatus 200. At this time, the separation start portion formed in the bonded substrate stack 30 was made to oppose a solid wedge 210.

A motor 213 was driven to move the wedge 210 parallel to the bonding interface of the bonded substrate stack 30 and insert the wedge 210 to the separation start portion of the bonded substrate stack 30 by only about 1.5 mm. Thus, a crack reaching the porous layer 12 as shown in FIG. 6 was formed in the bonded substrate stack 30. A portion outside the crack was omitted to form a separation start portion 60 having an almost semi-circular shape, as shown in FIG. 24 (FIG. 2D).

In this case, the wedge 210 made of a polytetrafluoroethylene (PTFE) resin was employed. For the employed wedge, an angle θ1 that the bonding interface made with the butt surface of the wedge 210 against the first substrate 10 was 20°, and an angle θ2 that the bonding interface made with the butt surface of the wedge 210 against the second substrate 20 was 10°. That is, the relation $0 \leq \theta 2 \leq \theta 1$ was satisfied (FIG. 8 or 9).

Next, substrate holding portions 103 and 104 of the processing apparatus 600 shown in FIG. 20 held the bonded substrate stack 30. The bonded substrate stack 30 was positioned such that the separation start portion opposed an ejection nozzle 106.

Separation was started by ejecting a fluid (water in this case) at a pressure of 400 kgf/cm² from the ejection nozzle 106 having a diameter of 0.1 mm to the separation start portion. After that, separation was progressed while rotating the bonded substrate stack 30, thereby spirally growing the crack in the second porous layer near the interface between the first and second porous layers along the interface. The crack reached the center of the bonded substrate stack 30, so the bonded substrate stack 30 could be completely separated into two substrates at the portion of the porous layer 12 (FIG. 2E).

A remaining porous layer 12b remaining on the surface of a second substrate 20' after separation was selectively etched using, as an etchant, a solution mixture of hydrofluoric acid with 49 wt % HF, hydrogen peroxide water with 30 wt % $H_2O_2$, and water (FIG. 2F). With this process, an SOI substrate as shown in FIG. 2F was obtained. The outer edge of a transferred single-crystal Si layer 13b was present within 2 mm from the outer edge of the substrate 20 and in tight contact with the substrate 20 via an insulating layer 14b over the entire circumference.

Next, the remaining porous layer 12b remaining on the single-crystal Si substrate 11 was selectively etched using, as an etchant, a solution mixture of hydrofluoric acid with 49 wt % HF, hydrogen peroxide water with 30 wt % $H_2O_2$, and water (FIG. 2G).

EXAMPLE 2

In Example 2, a second processing apparatus 300 and fifth processing apparatus 600 were applied to an SOI substrate manufacturing process.

Processes until formation of a bonded substrate stack 30 were executed according to the same procedures as in the above-described Example 1.

As shown in FIG. 11, the outer peripheral portion of the bonded substrate stack 30 was supported by a support portion 203 of the processing apparatus 200. At this time, the separation start portion formed in the bonded substrate stack 30 was made to oppose a wedge 220.

A motor 213 was driven to move the wedge 220 parallel to the bonding interface of the bonded substrate stack 30 and insert the wedge 220 to the separation start portion of the bonded substrate stack 30 by only about 1.5 mm.

In this case, the wedge 220 made of PTFE was employed. For the employed wedge 220, the butt surface of the wedge 220 against a second substrate 20 retreats from the first butt surface of the wedge 220 against a first substrate 10 by only 0.5 mm (i.e., D=0.5 mm>0) (FIG. 12 or 13). Thus, a crack reaching a porous layer 12 as shown in FIG. 6 was formed in the bonded substrate stack 30. A portion at the end of (outside) the crack was omitted to form a separation start portion 60 having an almost semi-circular shape, as shown in FIG. 24 (FIG. 2D).

Next, the actual separation process was executed using the processing apparatus 600 shown in FIG. 20, as in Example 1, to form an SOI substrate. In addition, a single-crystal Si substrate was recycled, as in Example 1.

EXAMPLE 3

In Example 3, a third processing apparatus 400 and fifth processing apparatus 600 were applied to the SOI substrate manufacturing process.

Processes until formation of a bonded substrate stack 30 were executed according to the same procedures as in the above-described Example 1.

As shown in FIG. 14, the outer peripheral portion of the bonded substrate stack 30 was supported by a support portion 203 of the processing apparatus 400. At this time, the separation start portion formed in the bonded substrate stack 30 was made to oppose a wedge 230.

A motor 213 was driven to move the wedge 230 parallel to the bonding interface of the bonded substrate stack 30 and insert the wedge 230 to the separation start portion of the bonded substrate stack 30 by only about 1.5 mm.

For the employed wedge 230, a first member 230a abutting against a first substrate 10 has a hardness higher than that of a second member 230b abutting against a second substrate 20. More specifically, the wedge 230 whose first member 230a was made of PEEK and second member 230b was made of rubber was employed (FIG. 15 or 16).

Thus, a crack reaching a porous layer 12 as shown in FIG. 6 was formed in the bonded substrate stack 30. A portion outside the crack was omitted to form a separation start portion 60 having an almost semi-circular shape, as shown in FIG. 20 (FIG. 2D).

Next, the actual separation process was executed using the processing apparatus 600 shown in FIG. 20, as in Example 1, to form an SOI substrate. In addition, a single-crystal Si substrate was recycled, as in Example 1.

EXAMPLE 4

In Example 4, a fourth processing apparatus 500 and fifth processing apparatus 600 were applied to an SOI substrate manufacturing process.

Processes until formation of a bonded substrate stack 30 were executed according to the same procedures as in the above-described Example 1.

As shown in FIG. 17, the outer peripheral portion of the bonded substrate stack 30 was supported by a support portion 203 of the processing apparatus 500. At this time, the separation start portion formed in the bonded substrate stack 30 was made to oppose a wedge 240.

A motor 213 was driven to move the wedge 240 parallel to the bonding interface of the bonded substrate stack 30 and insert the wedge 240 into the bonded substrate stack 30 by only about 1.5 mm while vibrating the wedge 240. Thus, a crack reaching a porous layer 12 as shown in FIG. 6 was formed in the bonded substrate stack 30. A portion at the end of the crack was omitted to form a separation start portion 60 having an almost semi-circular shape, as shown in FIG. 20 (FIG. 2D).

Next, the actual separation process was executed using the processing apparatus 600 shown in FIG. 20, as in Example 1, to form an SOI substrate. In addition, a single-crystal Si substrate was recycled, as in Example 1.

EXAMPLE 5

In Example 5, a first processing apparatus 200 and fifth processing apparatus 600 were used for an SOI substrate manufacturing process.

Processes until formation of a separation start portion 60 in a bonded substrate stack 30 were executed according to the same procedures as in the above-described Example 1.

Next, the bonded substrate stack 30 was held by the processing apparatus 600 shown in FIG. 20 and rotated, and a fluid at a pressure of 400 kgf/cm² was ejected, as in Example 1.

After the fluid hits against a portion near the rotating separation start portion 60, the crack spirally grew and reached the center of the bonded substrate stack 30, so the bonded substrate stack 30 was completely separated into two substrates.

The subsequent processes were the same as in Example 1.

EXAMPLE 6

In Example 6, a sixth processing apparatus 700 was used for an SOI substrate manufacturing process.

Processes until formation of a bonded substrate stack 30 were executed according to the same procedures as in the above-described Example 1.

Next, the bonded substrate stack 30 was held by the processing apparatus 700 shown in FIG. 21, and a fluid at a pressure of 2,000 kgf/cm$^2$ was ejected to the bonded substrate stack 30 in the still state to warp the end portion of a substrate 10 downward to form a separation start portion.

The pressure of the fluid was reduced to 400 kgf/cm$^2$, and then, the bonded substrate stack 30 was rotated to spirally grow the crack, thereby completely separating the bonded substrate stack 30 into two substrates.

The subsequent processes were the same as in Example 1.

According to the present invention, for example, a composite member such as a bonded substrate stack can be appropriately separated at a separation layer such as a porous layer.

As many apparently widely different embodiments of the present invention can be made without departing from the spirit and scope thereof, it is to be understood that the invention is not limited to the specific embodiments thereof except as defined in the appended claims.

What is claimed is:

1. A composite member separating method of separating a composite member formed by bonding a first member having a separation layer and a transfer layer on the separation layer to a second member, at a position different from a bonding interface between the first member and the second member, comprising:

the pre-separation step including the step of applying a force asymmetric with respect to the bonding interface to an end portion of the composite member to form, in the composite member, a crack that runs from a surface of the first member to the separation layer through the transfer layer; and the actual separation step including the step of growing the crack along the separation layer.

2. The method according to claim 1, wherein the actual separation step comprises growing the crack substantially in the separation layer or in an interface of the separation layer.

3. The method according to claim 1, wherein the transfer layer includes an insulating layer.

4. The method according to claim 1, wherein the transfer layer includes an insulating layer and a semiconductor layer.

5. The method according to claim 1, wherein the separation layer comprises a porous layer formed by anodizing.

6. The method according to claim 1, wherein the separation layer comprises an implantation layer formed by ion implantation.

7. The method according to claim 1, wherein the pre-separation step comprises applying the force asymmetric with respect to the bonding interface to the end portion of the composite member using at least one of a solid wedge and an asymmetric substrate holding mechanism.

8. The method according to claim 7, wherein the wedge has a pair of asymmetric tilted butt surfaces.

9. The method according to claim 7, wherein the wedge has a first butt surface abutting against the first member and a second butt surface abutting against the second member, and an angle the first butt surface makes with the bonding interface is larger than that the second butt surface makes with the bonding interface.

10. The method according to claim 7, wherein the pre-separation step comprises moving the wedge parallel to the bonding interface to insert the wedge to the end portion of the composite member.

11. The method according to claim 7, wherein the wedge has a first butt surface abutting against the first member and a second butt surface abutting against the second member, and the wedge has a structure with which the first butt surface abuts against the composite member before the second butt surface abuts against the composite member in inserting the wedge into the composite member.

12. The method according to claim 7, wherein the wedge has a first butt member abutting against the first member and a second butt member abutting against the second member, the first butt member having a hardness higher than that of the second butt member.

13. The method according to claim 7, wherein the pre-separation step comprises applying a vibration asymmetric with respect to the bonding interface to the wedge.

14. The method according to claim 7, wherein the wedge is made of a resin.

15. The method according to claim 1, wherein the actual separation step comprises injecting a fluid to the crack to grow the crack.

16. The method according to claim 15, wherein the fluid is a static pressure fluid or a jet fluid.

17. The method according to claim 1, wherein the pre-separation step comprises forming the crack without rotating the composite member, and the actual separation step comprises growing the crack while rotating the composite member.

18. The method according to claim 1, wherein the pre-separation step comprises forming the crack while suppressing warp of the second member to be smaller than warp of the first member.

19. The method according to claim 1, wherein the pre-separation step comprises holding the composite member by a substrate holding portion having a member for suppressing warp of the second member to be smaller than warp of the first member.

20. A thin film manufacturing method comprising the step of transferring the transfer layer of the first member on a surface side of the separation layer to the second member using the separating method of claim 1.

21. A thin film manufacturing method comprising:

the step of bonding a first member having a separation layer and a transfer layer on the separation layer to a second member to form a composite member; and the separation step of separating the composite member at a position different from a bonding interface between the first member and the second member, wherein the separation step comprises the first step of applying a force asymmetric with respect to the bonding interface to an end portion of the composite member to form, in the composite member, a crack that runs from a surface of the first member to the separation layer through the transfer layer, and the second step of growing the crack along the separation layer.

22. The method according to claim 21, wherein the second step comprises growing the crack substantially in the separation layer or in an interface of the separation layer.

23. The method according to claim 21, wherein the transfer layer includes an insulating layer.

24. The method according to claim 21, wherein the transfer layer includes an insulating layer and a semiconductor layer.

25. The method according to claim 21, wherein the separation layer comprises a porous layer formed by anodizing.

26. The method according to claim 21, wherein the separation layer comprises an implantation layer formed by ion implantation.

27. The method according to claim 21, wherein the first step comprises applying the force asymmetric with respect to the bonding interface to the end portion of the composite member using at least one of a solid wedge and an asymmetric substrate holding mechanism.

28. The method according to claim 27, wherein the wedge has a pair of asymmetric tilted butt surfaces.

29. The method according to claim 27, wherein the wedge has a first butt surface abutting against the first member and a second butt surface abutting against the second member, and an angle the first butt surface makes with the bonding interface is larger than that the second butt surface makes with the bonding interface.

30. The method according to claim 27, wherein the first step comprises moving the wedge parallel to the bonding interface to insert the wedge to the end portion of the composite member.

31. The method according to claim 27, wherein the wedge has a first butt surface abutting against the first member and a second butt surface abutting against the second member, and the wedge has a structure with which the first butt surface abuts against the composite member before the second butt surface abuts against the composite member in inserting the wedge into the composite member.

32. The method according to claim 27, wherein the wedge has a first butt member abutting against the first member and a second butt member abutting against the second member, the first butt member having a hardness higher than that of the second butt member.

33. The method according to claim 27, wherein the first step comprises applying a vibration asymmetric with respect to the bonding interface to the wedge.

34. The method according to claim 27, wherein the wedge is made of a resin.

35. The method according to claim 2, wherein the second step comprises injecting a fluid to the crack to grow the crack.

36. The method according to claim 35, wherein the fluid is a static pressure fluid or a jet fluid.

37. The method according to claim 21, wherein the first step comprises forming the crack without rotating the composite member, and the second step comprises growing the crack while rotating the composite member.

38. The method according to claim 21, wherein the first step comprises forming the crack while suppressing warp of the second member to be smaller than warp of the first member.

39. The method according to claim 38, wherein the first step comprises holding the composite member by a substrate holding portion having a member for suppressing warp of the second member to be smaller than warp of the first member.

40. The method according to claim 21, further comprising the step of, after the porous layer as the separation layer is formed on the surface of the substrate, forming a non-porous semiconductor layer and insulating layer to cover the porous layer, thereby forming the first member.

41. The method according to claim 21, further comprising the step of implanting ions from the surface side of the substrate to form an ion implantation layer as the separation layer in the substrate, thereby forming the first member.

42. The method according to claim 21, further comprising the step of annealing the composite member in an oxidation atmosphere.

43. The method according to claim 21, wherein said method further comprises the step of annealing the composite member in an oxidation atmosphere to form an oxide film on a surface of the composite member, and the crack that runs from the surface of the first member to the separation layer crosses the oxide film.

44. The method according to claim 21, wherein the thin film is an SOI layer formed on an insulating surface.

45. A composite member separating apparatus for separating a composite member formed by bonding a first member having a separation layer and a transfer layer on the separation layer to a second member, at a position different from a bonding interface between the first member and the second member, the apparatus comprising:

a pre-separation mechanism for applying a force asymmetric with respect to the bonding interface to an end portion of the composite member, said pre-separation mechanism comprising at least one of a solid wedge or an asymmetric substrate holding mechanism to form, in the composite member, a crack that runs from a surface of the first member to the separation layer through the transfer layer and an actual separation mechanism for growing the crack along the separation layer.

46. A composite member separating apparatus for separating a composite member formed by bonding a first member having a separation layer and a transfer layer on the separation to a second member, at a position different from a bonding interface between the first member and the second member, the apparatus comprising:

a pre-separation mechanism for applying a force asymmetric with respect to the bonding interface to an end portion of the composite member by ejecting a fluid toward the composite member to form, in the composite member, a crack that runs from a surface of the first member to the separation layer through the transfer layer, and an actual separation mechanism for growing the crack along the separation layer.

47. A composite member separating apparatus for separating a composite member formed by bonding a first member having a separation layer and a transfer layer on the separation layer to a second member, at a position different from a bonding interface between the first and the second member, the apparatus comprising:

a pre-separation mechanism for applying a force asymmetric with respect to the bonding interface to an end portion of the composite member while suppressing warp of the second member to be smaller than warp of the first member to form, in the composite member, a crack that runs from a surface of the first member to the separation layer through the transfer layer; and an actual separation mechanism for growing the crack along the separation layer.

* * * * *

UNITED STATES PATENT AND TRADEMARK OFFICE
CERTIFICATE OF CORRECTION

PATENT NO. : 6,653,205 B2
DATED : June 28, 2004
INVENTOR(S) : Kazutaka Yanagita et al.

It is certified that error appears in the above-identified patent and that said Letters Patent is hereby corrected as shown below:

Title page,
Item [75], Inventors, "Kazutaka Yanagita, Ohta-ku (JP); Kazuaki Ohmi, Ohta-ku (JP); Kiyofumi Sakaguchi, Ohta-ku (JP)" should read -- "Kazutaka Yanagita, Ohta-ku (JP); Kazuaki Ohmi, Kanagawa (JP); Kiyofumi Sakaguchi, Kanagawa (JP) --.

Item [57], ABSTRACT,
Line 11, "is grown" should be deleted.

Column 6,
Line 8, "$(4-\lambda)e^+e\rightarrow$" should read -- $(4-\lambda)e^+\rightarrow$ --.

Column 8,
Line 43, "so-called a " should read -- a so-called --.

Column 12,
Line 39, "to them" should be deleted.

Column 15,
Line 35, "of the by" should read -- of the --; and
Line 36, "the chuck" should read -- chuck --.

Signed and Sealed this

Twenty-fourth Day of August, 2004

JON W. DUDAS
*Director of the United States Patent and Trademark Office*

UNITED STATES PATENT AND TRADEMARK OFFICE
CERTIFICATE OF CORRECTION

PATENT NO. : 6,653,205 B2
DATED : June 28, 2004
INVENTOR(S) : Kazutaka Yanagita et al.

It is certified that error appears in the above-identified patent and that said Letters Patent is hereby corrected as shown below:

Title page,
Item [75], Inventors, "Kazutaka Yanagita, Ohta-ku (JP); Kazuaki Ohmi, Ohta-ku (JP); Kiyofumi Sakaguchi, Ohta-ku (JP)" should read -- "Kazutaka Yanagita, Kanagawa (JP); Kazuaki Ohmi, Kanagawa (JP); Kiyofumi Sakaguchi, Kanagawa (JP) --.

Item [57], ABSTRACT,
Line 11, "is grown" should be deleted.

Column 6,
Line 8, "$(4-\lambda)e^+e\rightarrow$" should read -- $(4-\lambda)e^+ \rightarrow$ --.

Column 8,
Line 43, "so-called a " should read -- a so-called --.

Column 12,
Line 39, "to them" should be deleted.

Column 15,
Line 35, "of the by" should read -- of the --; and
Line 36, "the chuck" should read -- chuck --.

This certificate supersedes Certificate of Correction issued August 24, 2004.

Signed and Sealed this

Twenty-sixth Day of July, 2005

JON W. DUDAS
*Director of the United States Patent and Trademark Office*